US011038279B2

(12) United States Patent
Kim et al.

(10) Patent No.: US 11,038,279 B2
(45) Date of Patent: Jun. 15, 2021

(54) ANTENNA MODULE

(71) Applicant: SAMSUNG ELECTRONICS CO., LTD., Suwon-si (KR)

(72) Inventors: Doo Il Kim, Suwon-si (KR); Jung Hyun Cho, Suwon-si (KR); Won Wook So, Suwon-si (KR); Young Sik Hur, Suwon-si (KR); Yong Ho Baek, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/746,064

(22) Filed: Jan. 17, 2020

(65) Prior Publication Data

US 2020/0153110 A1 May 14, 2020

Related U.S. Application Data

(63) Continuation of application No. 15/972,905, filed on May 7, 2018, now Pat. No. 10,547,119.

(30) Foreign Application Priority Data

Dec. 6, 2017 (KR) ........................ 10-2017-0166856

(51) Int. Cl.
*H01Q 21/00* (2006.01)
*H01Q 1/02* (2006.01)
(Continued)

(52) U.S. Cl.
CPC ........... *H01Q 21/0006* (2013.01); *H01Q 1/02* (2013.01); *H01Q 1/2283* (2013.01); *H01Q 1/38* (2013.01);
(Continued)

(58) Field of Classification Search
CPC .. H01Q 21/00; H01Q 21/0006; H01Q 21/065; H01Q 21/28; H01Q 9/0414; H01Q 1/523; H01Q 1/2283; H01Q 3/24
See application file for complete search history.

(56) References Cited

U.S. PATENT DOCUMENTS 8,138,599 B2  3/2012  Megahed
9,331,030 B1  5/2016  Tsai et al.
(Continued)

FOREIGN PATENT DOCUMENTS

JP  2007-123506 A  5/2007
JP  2009-38696 A   2/2009
(Continued)

OTHER PUBLICATIONS

Communication dated Jun. 26, 2019, issued by the Korean Patent Office in counterpart Korean Patent Application No. 10-2017-0166856.
(Continued)

*Primary Examiner* — Hoang V Nguyen
(74) *Attorney, Agent, or Firm* — Sughrue Mion, PLLC

(57) ABSTRACT

An antenna module includes a connection member including at least one wiring layer and at least one insulating layer; an integrated circuit (IC) package disposed on a first surface of the connection member; and an antenna package including a plurality of antenna members and a plurality of feed vias, and disposed on a second surface of the connection member, wherein the IC package includes: an IC having an active surface electrically connected to at least one wiring layer and an inactive surface opposing the active surface, and generating the RF signal; a heat sink member disposed on the inactive surface of the IC; and an encapsulant encapsulating at least portions of the IC and the heat sink member.

12 Claims, 26 Drawing Sheets

(51) Int. Cl.
*H01Q 1/38* (2006.01)
*H01Q 21/28* (2006.01)
*H01Q 1/22* (2006.01)
*H01Q 3/24* (2006.01)
*H01Q 21/06* (2006.01)
*H01Q 9/04* (2006.01)
*H01Q 1/52* (2006.01)
*H01Q 1/24* (2006.01)

(52) U.S. Cl.
CPC ............... *H01Q 1/523* (2013.01); *H01Q 3/24* (2013.01); *H01Q 9/0414* (2013.01); *H01Q 21/065* (2013.01); *H01Q 21/28* (2013.01); *H01Q 1/243* (2013.01)

(56) References Cited

U.S. PATENT DOCUMENTS

| | | | |
|---|---|---|---|
| 2003/0052420 A1* | 3/2003 | Suzuki | H01L 23/4334 257/787 |
| 2009/0153427 A1 | 6/2009 | Rofougaran | |
| 2009/0315797 A1* | 12/2009 | Rofougaran | H01Q 9/0407 343/787 |
| 2011/0116246 A1 | 5/2011 | Lee et al. | |
| 2012/0188138 A1 | 7/2012 | Liu | |
| 2013/0009320 A1 | 1/2013 | Yoo et al. | |
| 2013/0037950 A1 | 2/2013 | Yu et al. | |
| 2013/0127037 A1 | 5/2013 | Mori et al. | |
| 2013/0334682 A1 | 12/2013 | Kim | |
| 2014/0145883 A1* | 5/2014 | Baks | H01Q 1/2283 343/700 MS |
| 2015/0036305 A1 | 2/2015 | Nanjo | |
| 2015/0309626 A1 | 10/2015 | Prendergast | |
| 2015/0325925 A1 | 11/2015 | Kamgaing | |
| 2016/0056544 A1 | 2/2016 | Garcia | |
| 2016/0240492 A1 | 8/2016 | Wolter et al. | |
| 2016/0338202 A1 | 11/2016 | Park et al. | |
| 2017/0062299 A1 | 3/2017 | Auchere et al. | |
| 2017/0127567 A1 | 5/2017 | Besancon | |
| 2017/0213794 A1 | 7/2017 | Baek et al. | |

FOREIGN PATENT DOCUMENTS

| | | |
|---|---|---|
| JP | 2011-109066 A | 6/2011 |
| JP | 2015-32729 A | 2/2015 |
| KR | 10-2004-0036270 A | 4/2004 |
| KR | 10-2010-0096513 A | 9/2010 |
| KR | 10-2012-0075855 A | 7/2012 |
| KR | 10-2013-0005811 A | 1/2013 |
| KR | 10-2013-0018090 A | 2/2013 |
| KR | 10-2013-0139601 A | 12/2013 |
| KR | 10-2016-0067961 A | 6/2016 |
| KR | 10-2016-0132763 A | 11/2016 |
| KR | 10-2017-0071826 A | 6/2017 |
| KR | 10-2017-0088194 A | 8/2017 |
| WO | 2011/122228 A1 | 10/2011 |

OTHER PUBLICATIONS

Office Action issued in corresponding Korean Application No. 10-2017-0166856, dated Mar. 10, 2019.

* cited by examiner

ANTENNA MODULE

CROSS-REFERENCE TO RELATED APPLICATION(S)

This application is a continuation of U.S. application Ser. No. 15/972,905, filed May 7, 2018, which claims benefit of priority to Korean Patent Application No. 10-2017-0166856 filed on Dec. 6, 2017 in the Korean Intellectual Property Office, the disclosures of which are incorporated herein by reference in their entireties.

TECHNICAL FIELD

1. Field

The present disclosure relates to an antenna module.

BACKGROUND

2. Description of Related Art

Recently, millimeter wave (mmWave) communications, including 5th generation (5G) communications, have been actively researched, and research into the commercialization of an antenna module able to smoothly implement millimeter wave communications is being actively undertaken.

Conventionally, an antenna module providing a millimeter wave communications environment uses a structure in which an integrated circuit (IC) and an antenna are disposed on a board and are connected to each other by a coaxial cable in order to satisfy a high level of antennal performance (e.g., a transmission and reception rate, a gain, directivity, and the like) according to a high frequency.

However, such a structure may cause a shortage of antenna layout space, a restriction of the degree of freedom of an antenna shape, an increase in interference between the antenna and the IC, and an increase in the size/cost of the antenna module.

SUMMARY

An aspect of the present disclosure may provide an antenna module able to be easily miniaturized, while having a high level of antenna performance.

According to an aspect of the present disclosure, an antenna module may include a connection member including at least one wiring layer and at least one insulating layer; an integrated circuit (IC) package disposed on a first surface of the connection member; and an antenna package including a plurality of antenna members configured to transmit and receive a radio frequency (RF) signal, a plurality of feed vias in which one end of each thereof is electrically connected to each of the plurality of antenna members and the other end of each thereof is electrically connected to a corresponding wire of the at least one wiring layer, and a dielectric layer disposed to surround side surfaces of each of the plurality of feed vias and having a height greater than that of the at least one insulating layer, and disposed on a second surface of the connection member, wherein the IC package includes: an IC having an active surface electrically connected to the at least one wiring layer and an inactive surface opposing the active surface, and configured to generate the RF signal; a heat sink member disposed on the inactive surface of the IC; and an encapsulant encapsulating at least portions of the IC and the heat sink member.

According to another aspect of the present disclosure, an antenna module may include a connection member including at least one wiring layer and at least one insulating layer; an integrated circuit (IC) package disposed on a first surface of the connection member; and an antenna package including a plurality of antenna members configured to transmit and receive a radio frequency (RF) signal, a plurality of feed vias in which one end of each thereof is electrically connected to each of the plurality of antenna members and the other end of each thereof is electrically connected to a corresponding wire of the at least one wiring layer, and a dielectric layer disposed to surround side surfaces of each of the plurality of feed vias and having a height greater than that of the at least one insulating layer, and disposed on a second surface of the connection member, wherein the IC package includes: a first IC having a first active surface electrically connected to the at least one wiring layer and a first inactive surface opposing the first active surface and configured to generate the RF signal; a second IC having a second inactive surface facing the first inactive surface of the first IC and a second inactive surface opposing the second inactive surface and electrically connected to the at least one wiring layer, and configured to generate a base signal or power; a core via disposed on side surfaces of the first and second ICs and having one end electrically connected to the at least one wiring layer and the other end electrically connected to the second active surface; and an encapsulant encapsulating at least portions of the first and second ICs and the core via.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Hereinafter, exemplary embodiments of the present disclosure will now be described in detail with reference to the accompanying drawings.

Figure 1:
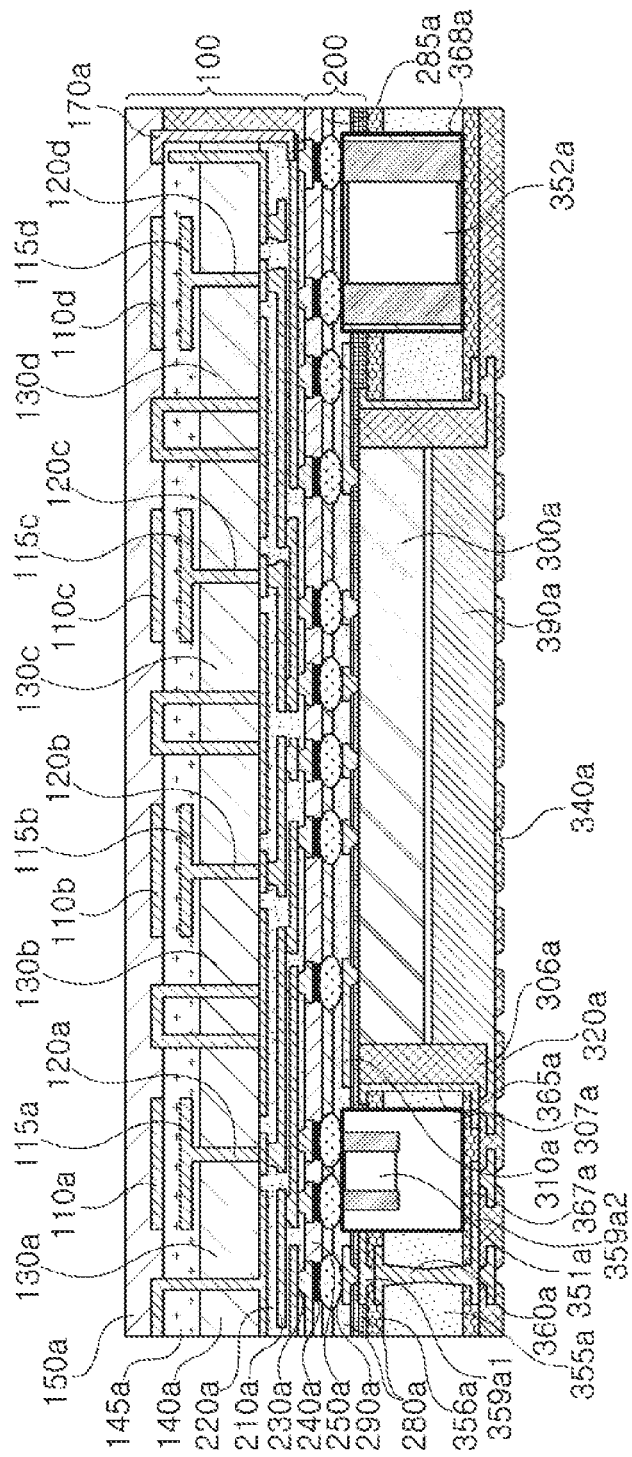
FIG. 1 is a cross-sectional view of an antenna module having a heat sink member according to an exemplary embodiment in the present disclosure.

FIG. 1 is a cross-sectional view of an antenna module having a heat sink member according to an exemplary embodiment in the present disclosure.

Referring to FIG. 1, an antenna module according to an exemplary embodiment in the present disclosure may include an antenna package 100, a connection member 200, and an integrated circuit (IC) package.

Referring to FIG. 1, an antenna package 100 may include a plurality of antenna members 115a, 115b, 115c, and 115d configured to transmit or receive a radio frequency (RF) signal, a plurality of feed vias 120a, 120b, 120c, and 120d in which one end of each thereof is electrically connected to each of the plurality of antenna members 115a, 115b, 115c, and 115d and the other end of each of thereof is electrically connected to a corresponding wire of at least one wiring layer 210a, and dielectric layers 140a and 145a having thicknesses greater than a thickness of at least one insulating layer 220a of the connection member 200, and may be disposed on the connection member 200. Accordingly, the antenna module according to an exemplary embodiment in the present disclosure may have a radiation pattern in an upper direction to transmit and receive the RF signal.

Due to lengths of the feed vias 120a, 120b, 120c, and 120d and thicknesses of the dielectric layers 140a and 145a, a boundary condition for transmission and reception operation of the RF signal of the plurality of antenna members 115a, 115b, 115c, and 115d may be freely designed, and an unnecessary boundary condition (e.g., an interlayer interval, an interlayer implant, or the like) may be removed. Accordingly, since the feed vias 120a, 120b, 120c, and 120d and the dielectric layers 140a and 145a may provide boundary conditions (e.g., small manufacturing tolerance, a short electrical length, a smooth surface, a large margin space, a dielectric constant adjustment, and the like) advantageous to the transmission and reception operation of the RF signal of the plurality of antenna members 115a, 115b, 115c, and 115d, antenna performance of the plurality of antenna members 115a, 115b, 115c, and 115d may be improved.

The dielectric layers 140a and 145a may be formed of a thermosetting resin such as an epoxy resin, a thermoplastic resin such as a polyimide, a resin in which the thermosetting resin or the thermoplastic resin is impregnated together with an inorganic filler in a core material such as a glass fiber (or a glass cloth or a glass fabric), for example, prepreg, Ajinomoto Build up Film (ABF), FR-4, Bismaleimide Triazine (BT), or the like, and may be formed of a photo imagable dielectric (PID) resin depending on a design. For example, the dielectric layers 140a and 145a may be formed of a generic copper clad laminate (CCL) or a glass or ceramic based insulating material depending on required material characteristics. Depending on a design, the dielectric layers 140a and 145a may be formed of a material having a dielectric constant Dk higher than that of at least one insulating layer 220a of the connection member 200.

Depending on a design, the antenna package 100 may further include a plurality of director members 110a, 110b, 110c, and 110d disposed on the plurality of antenna members 115a, 115b, 115c, and 115d and configured to transmit or receive a first RF signal together with the plurality of antenna members 115a, 115b, 115c, and 115d. The number of layers in which the plurality of director members 110a, 110b, 110c, and 110d are formed may be determined depending on a design condition of a gain and a height of the antenna module. Therefore, the number of layers is not limited to one.

Depending on a design, the antenna package 100 may include a plating member disposed to surround side surfaces of each of the feed vias 120a, 120b, 120c, and 120c and forming a plurality of cavities 130a, 130b, 130c, and 130d. The plurality of cavities 130a, 130b, 130c, and 130d may provide boundary conditions (e.g., a small manufacturing tolerance, a short electrical length, a smooth surface, a large margin space, an adjustment of a dielectric constant, and the like) advantageous in forming the radiation pattern of the plurality of antenna members 115a, 115b, 115c, and 115d, and may improve isolation between the plurality of antenna members 115a, 115b, 115c, and 115d.

Depending on a design, the antenna package 100 may further include an encapsulation member 150a disposed on the plurality of antenna members 115a, 115b, 115c, and 115d. The encapsulation member 150a may be changed to a solid state from a liquid state in a state in which it partially permeates down. Accordingly, structural stability of the antenna package 100 may be improved. In addition, the encapsulation member 150a may be formed together with the plurality of director members 110a, 110b, 110c, and 110d in a process of forming the encapsulation member 150a. The encapsulation member 150a may be formed of a photo imageable encapsulant (PIE), Ajinomoto build-up film (ABF), epoxy molding compound (EMC), or the like, but is not limited thereto.

Depending on a design, the antenna package 100 may further include at least one second directional antenna member 170a configured to extend in a direction toward the antenna package 100 at a corresponding position of at least one wiring layer 210a and to transmit or receive the RF signal. That is, the antenna module according to an exemplary embodiment in the present disclosure may transmit and receive the RF signal in a side surface as well as an upper surface.

Meanwhile, the antenna member 115a, 115b, 115c, and 115d, the feed vias 120a, 120b, 120c, and 120d, and the plating member may be formed by a plating method such as chemical vapor deposition (CVD), physical vapor deposition (PVD), sputtering, subtractive, additive, semi-additive process (SAP), modified semi-additive process (MSAP), or the like, but is not limited thereto.

Referring to FIG. 1, the connection member 200 may include at least one wiring layer 210a, at least one insulating layer 220a, a wiring via 230a, a connection pad 240a, a passivation layer 250a, and an electrical connection structure 290a, and may have a structure similar to a copper redistribution layer.

For example, a portion and the remainder of each of at least one wiring layer 210a, at least one insulating layer 220a, and the wiring via 230a included in the connection member 200 may be manufactured independently from each other and may be then connected to each other through the connection pad 240a, the passivation layer 250a, and the electrical connection structure 290a. Depending on a design, since at least one wiring layer 210a, at least one insulating layer 220, and wiring via 230a maybe integrally manufactured, the connection pad 240a, the passivation layer 250a, and the electrical connection structure 290a may be omitted.

Referring to FIG. 1, the IC package may include an IC 300a, an encapsulant 306a, and a heat sink member 390a.

The IC 300a may have an active surface (e.g., an upper surface) electrically connected to at least one wiring layer 210a and an inactive surface (e.g., a lower surface) opposing the active surface, and may transmit the RF signal to the antenna package 100 and receive the RF signal from the antenna package 100.

The active surface may be connected to an upper end wiring layer 310a to secure a transfer path of the RF signal. Here, the upper end wiring layer 310a and the insulating layer 280a may be integrated with the connection member 200.

The IC 300a may generate a large amount of heat in a process of generating and/or processing the RF signal. The heat may act as noise in the antenna package 100 or the connection member 200.

The encapsulant 306a may encapsulate at least a portion of the IC 300a and the heat sink member 390a. The encapsulant 306a may protect the IC 300a and the heat sink member 390a from external electrical/physical/chemical impact, and may be formed of a photo imageable encapsulant (PIE), Ajinomoto build-up film (ABF), epoxy molding compound (EMC), or the like, but is not limited thereto.

The heat sink member 390a may be disposed on the inactive surface (e.g., the lower end) of the IC 300a. The heat generated by the IC 300a may be further concentrated on the heat sink member 390a by the encapsulant 306a and the heat sink member 390, and the heat sink member 390a may discharge the transferred heat to the outside of the IC package.

Accordingly, a ratio of the heat transferred to the antenna package 100 or the connection member 200 among the heat generated by the IC 300a may be reduced, and the antenna module according to an exemplary embodiment in the present disclosure may have more improved antenna performance.

In addition, since the heat sink member 390a is disposed on the inactive surface of the IC 300a, the heat sink member 390a may be disposed to be adjacent to the IC 300a. Accordingly, since a height of the antenna module according to an exemplary embodiment in the present disclosure may be shortened, the antenna module may be miniaturized.

Depending on a design, the IC package may further include a support member 355a disposed on side surfaces of the IC 300a and the heat sink member 390a and having at least a portion encapsulated by the encapsulant 306a. The support member 355a may have a through-hole 355H in which the IC 300a and the heat sink member 390a are disposed, and thus may surround the side surfaces of the IC 300a and the heat sink member 390a. The support member 355a may constrain the heat generated from the IC 300a such that a significant portion of the heat generated from the IC 300a may be transferred to the heat sink member 390a.

Depending on a design, the support member 355a may have a height higher than that of the IC 300a, and the heat sink member 390a may have a shape protruding in a direction viewing the IC 300a. That is, the lower surface of the heat sink member 390a may be below the lower surface of the support member 355a. Accordingly, the heat generated from the IC 300a may be more effectively guided to the heat sink member 390a rather than to the support member 355a, and the heat sink member 390a may more rapidly discharge the transferred heat to the outside of the IC package.

Depending on a design, the IC package may further include a core plating member 365a disposed on a side surface toward the IC 300a and the heat sink member 390a from the support member 355a. The core plating member 365a may absorb heat and noise generated from the IC 300a, and may discharge the absorbed heat to the outside of the IC package.

Here, the heat sink member 390a may be electrically connected to the core plating member 365a at least through a lower end wiring layer 320a disposed below a lower core wiring layer 359a2 of the support member 355a. The heat sink member 390a may include a heat sink member, for example, a metal block, and may be made of, for example, copper (Cu), aluminum (Al), silver (Ag), tin (Sn), gold (Au), nickel (Ni), lead (Pb), titanium (Ti), or an alloy thereof. The heat sink member 390a may be mounted to the IC 300a by an adhesive layer 303a. The heat sink member 390a may further include a plating layer on the heat sink member by a process used to form the lower end wiring layer 320a. Thus, the lower end wring layer 320a and a lower portion of the heat sink member 390a may be integrally formed and may be made of a conductive material used in the plating process. A thickness of the heat sink member 390a may be greater than that of the lower end wiring layer 320a. A lower surface of the heat sink member 390 and a lower surface of the lower end wiring layer 320a may be on a same level while an upper surface of the heat sink member 390 may be on a level between upper and lower surfaces of the support member 355a. Accordingly, the core plating member 365a may more rapidly discharge the absorbed heat to the outside of the IC package. However, plating on the heat sink member may be omitted, and in this case, the heat sink member 390 may be spaced apart from the lower end wiring layer 320a.

Meanwhile, the support member 355a may include a core dielectric layer 356a in contact with the upper end wiring layer 310a, upper and lower core wiring layer 359a1 and 359a2 disposed on an upper surface and a lower surface of the core dielectric layer 356a, and at least one core via 360a penetrating through the core dielectric layer 356a and electrically connecting the upper and lower core wiring layers 359a1 and 359a2 to each other. The upper core wiring layer 359a1 maybe electrically connected to connection pads of the IC 300a. At least portions of the lower end wiring layer 320a may be electrically connected to the lower core wiring layer 359a2 and electrical connection structure 340a such as a solder ball, a pin, and a land.

The core via 360a may receive a base signal and/or power through the electrical connection structure 340a, and may transmit the base signal and/or power to the active surface of the IC 300a through the upper end wiring layer 310a.

Here, the IC 300a may generate an RF signal of a millimeter wave band (e.g., 28 GHz) based on the base signal and/or power, and may transmit the RF signal to the antenna package 100 through the active surface of the IC 300a. For example, the IC 300a may receive a base signal of a low frequency, and may perform a frequency conversion, amplification, a filtering phase control, and a power generation of the base signal.

Meanwhile, the IC package may further include passive components 351a and 352a electrically connected to a corresponding wire of the upper end wiring layer 310a. The passive components 351a and 352a may be disposed in an accommodation space 307a provided by the support member 355a and may provide impedance to the IC 300a. For example, the passive components 351a and 352a may include at least a portion of a multilayer ceramic capacitor (MLCC), an inductor, or a chip resistor.

In addition, the support member 355a may further include core interior plating members 367a and 368a disposed to surround the passive components 351a and 352a in the accommodation space 307a.

The passive components 351a and 352a may be isolated from the IC 300a by the core plating member 365a and/or the core interior plating members 367a and 368a. Accordingly, a negative influence (e.g., heat and noise) of the passive components 351a and 352a on the IC 300a, the antenna package 100, and the connection member 200 may be reduced.

Figure 2:
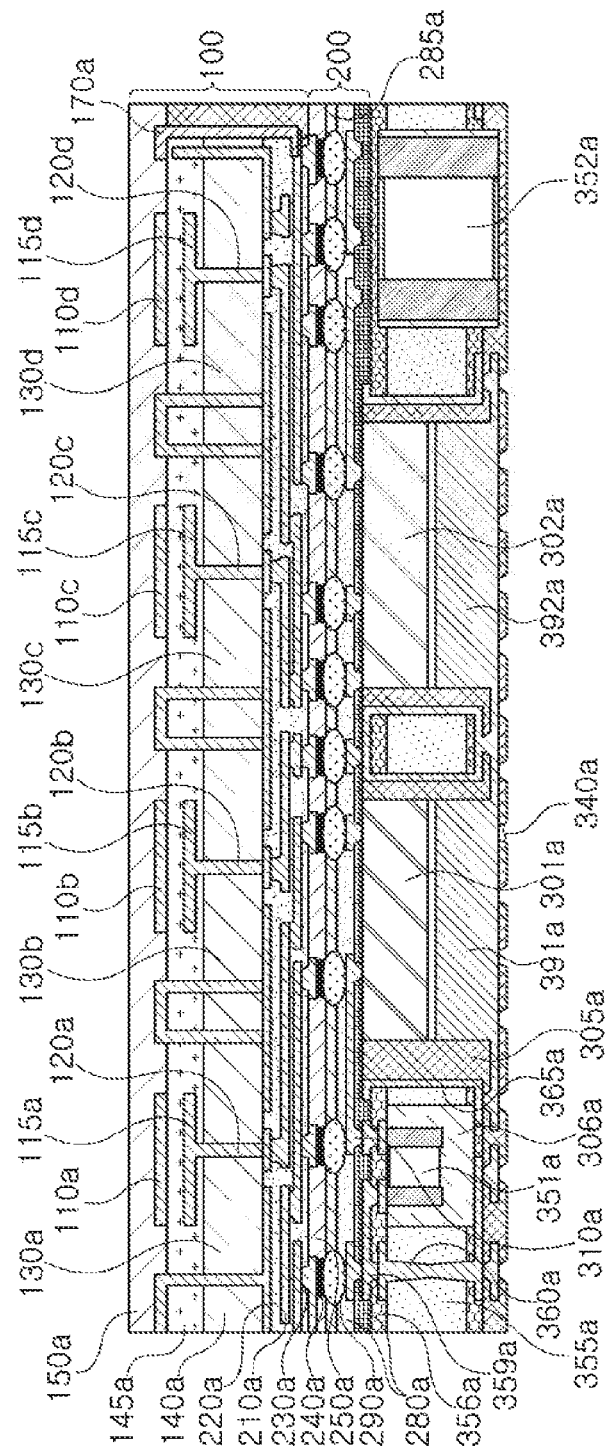
FIG. 2 is a cross-sectional view of an antenna module having first and second ICs according to an exemplary embodiment in the present disclosure.

FIG. 2 is a cross-sectional view of an antenna module having first and second ICs according to an exemplary embodiment in the present disclosure.

Referring to FIG. 2, the IC package may include a first IC 301a, a second IC 302a, an encapsulant 305a, a first heat sink member 391a, and a second heat sink member 392a.

The first IC 301a may have a first active surface (e.g., an upper surface) electrically connected to at least one wiring layer 210a and a first inactive surface (e.g., a lower surface) opposing the first active surface, and may transmit an RF signal to the antenna package 100 and receive the RF signal from the antenna package 100.

The second IC 302a may have a second active surface (e.g., an upper surface) electrically connected to at least one wiring layer 210a and a second inactive surface (e.g., a lower surface) opposing the second active surface, and may generate a base signal or power and transmit the base signal or power to the first IC 301a.

Accordingly, since an electrical distance between the first IC 301a and the second IC 302a may be close, the second IC 302a may more efficiently transmit the base signal or power to the first IC 301a.

The encapsulant 305a may encapsulate at least a portion of each of the first IC 301a, the second IC 302a, the first heat sink member 391a, and the second heat sink member 392a.

The first heat sink member 391a may be disposed on the first inactive surface of the first IC 301a.

The second heat sink member 392a may be disposed on the second inactive surface of the second IC 302a.

The second IC 302a may generate a large amount of heat in a process of generating and/or processing the base signal or power. The heat may act as noise in the antenna package 100 or the connection member 200, and may also act as noise in the first IC 301a.

That is, the second heat sink member 392a may be disposed so that the heat generated from the second IC 302a is more concentrated on the second heat sink member 392a, and the second heat sink member 392a may discharge the transferred heat to the outside of the IC package.

Accordingly, a ratio of the heat transferred to the antenna package 100, the connection member 200, or the first IC 301a among the heat generated from the second IC 302a may be reduced.

Depending on a design, the IC package may further include a support member 355a having first and second IC cavities, in which the first IC 301a and the second IC 302a are respectively disposed. Accordingly, a negative influence (e.g., heat and noise) between the first IC 301a and the second IC 302a may be reduced.

In addition, the IC package may further include a core plating member 365a disposed on side surfaces of the support member 355a toward the first IC 301a and the second IC 302a. Accordingly, the negative influence between the first IC 301a and the second IC 302a may be further reduced, and the heat generated from the first IC 301a and the second IC 302a may be more efficiently discharged to the outside of the IC package.

Here, the core plating member 365a may be electrically connected to at least one of the first heat sink member 391a and the second heat sink member 392a at least through a lower end wiring layer 320a disposed below a lower core wiring layer 359a2 of the support member 355a. Each of the first and second heat sink members 391a and 392a2 may include a heat sink member, for example, a metal block, and may be made of, for example, copper (Cu), aluminum (Al), silver (Ag), tin (Sn), gold (Au), nickel (Ni), lead (Pb), titanium (Ti), or an alloy thereof. The first and second heat sink members 391a and 392a2 may be mounted to the first and second ICs 301a and 302a by adhesive layers 303a1 and 303a2, respectively. Each heat sink members 391a and 392a2 may further include a plating layer on the heat sink member by a process used to form the lower end wiring layer 320a. Thus, the lower end wring layer 320a and lower portions of the first and second heat sink members 391a and 392a may be integrally formed and may be made of a conductive material used in the plating process. A thickness of the first and second heat sink members 391a and 392a2 may be greater than that of the lower end wiring layer 320a. Lower surfaces of the first and second heat sink members 391a and 392a and a lower surface of the lower end wiring layer 320a may be on a same level while upper surfaces of the first and second heat sink members 391a and 392a may be on a level between upper and lower surfaces of the support member 355a. Accordingly, the core plating member 365a may more rapidly discharge the absorbed heat to the outside of the IC package. However, plating on one or both heat sink members may be omitted, and in this case, one or both of the first and second heat sink members 391a and 392a may be spaced apart from the lower end wiring layer 320a.

Other contents overlap those described above, and a detailed description thereof is thus omitted.

Figure 3:
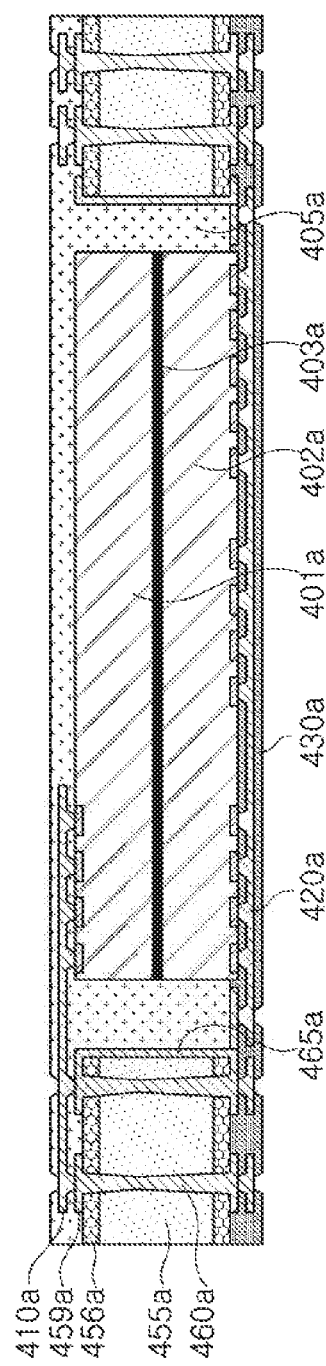
FIG. 3 is a view illustrating an example of an IC package included in an antenna module according to an exemplary embodiment in the present disclosure.

FIG. 3 is a view illustrating another example of an IC package included in an antenna module according to an exemplary embodiment in the present disclosure.

Referring to FIG. 3, the IC package may include at least portions of a first IC 401a, a second IC 402a, an adhesive member 403a, an encapsulant 405a, an upper end wiring layer 410a, a lower end wiring layer 420a, a passivation layer 430a, a support member 455a, a dielectric layer 456a, a core wiring layer 459a, and a core via 460a.

The first IC 401a may have a first active surface and a first inactive surface opposing the first active surface, and may generate an RF signal. Connection pads on the first active surfaces of the first IC 401a may be electrically connected to a core wiring layer 459a at least through an upper end wiring layer 410a.

The second IC 402a may generate a base signal or power and have a second inactive surface facing the first inactive surface of the first IC 401a and a second active surface opposing the second inactive surface. Connection pads on the second active surfaces of the second IC 402a may be electrically connected to a lower end wiring layer 420a which may be connected to the upper end wiring layer 410a at least through the core via 460a.

Since the core via 460a and the core wiring layer 459a may be electrically connected to the upper end wiring layer 410a or the lower end wiring layer 420a, the base signal or power generated from the second IC 402a maybe transmitted to the first IC 401a through the core via 460a.

The IC package may further include a core plating member 465a disposed on a side surface toward the first IC 401a and the second IC 402a. The core plating member 465a may absorb heat and noise generated from the first IC 401a and the second IC 402a, and may discharge the absorbed heat to the outside of the IC package.

Since the first inactive surface of the first IC 401a and the second inactive surface of the second IC 402a are adjacent to each other, the IC package may be miniaturized or secure a layout margin of other components (e.g., a heat sink member and a passive component) to thereby improve antenna performance.

Figure 4:
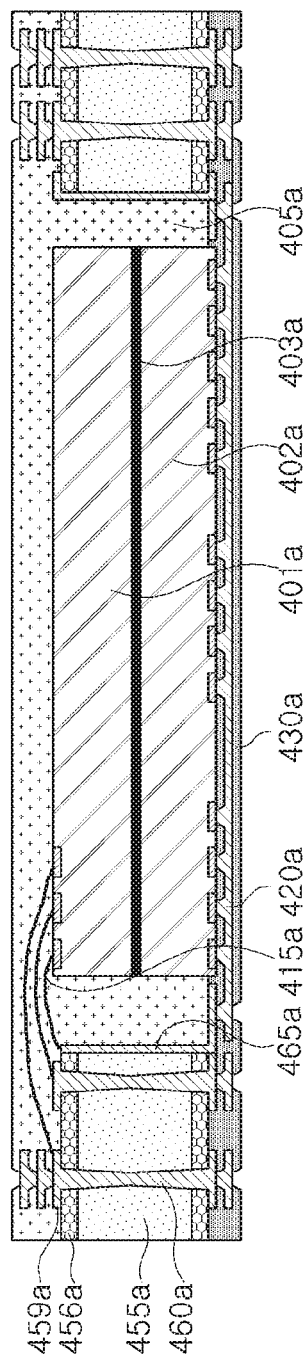
FIG. 4 is a view illustrating another example of an IC package included in an antenna module according to an exemplary embodiment in the present disclosure.

FIG. 4 is a view illustrating another example of an IC package included in an antenna module according to an exemplary embodiment in the present disclosure.

Referring to FIG. 4, connection pads of the first IC 401 may be electrically connected to the core via 460a through a wire bonding. Other contents overlap those described above with reference to FIG. 3, and a detailed description thereof is thus omitted.

Figure 5:
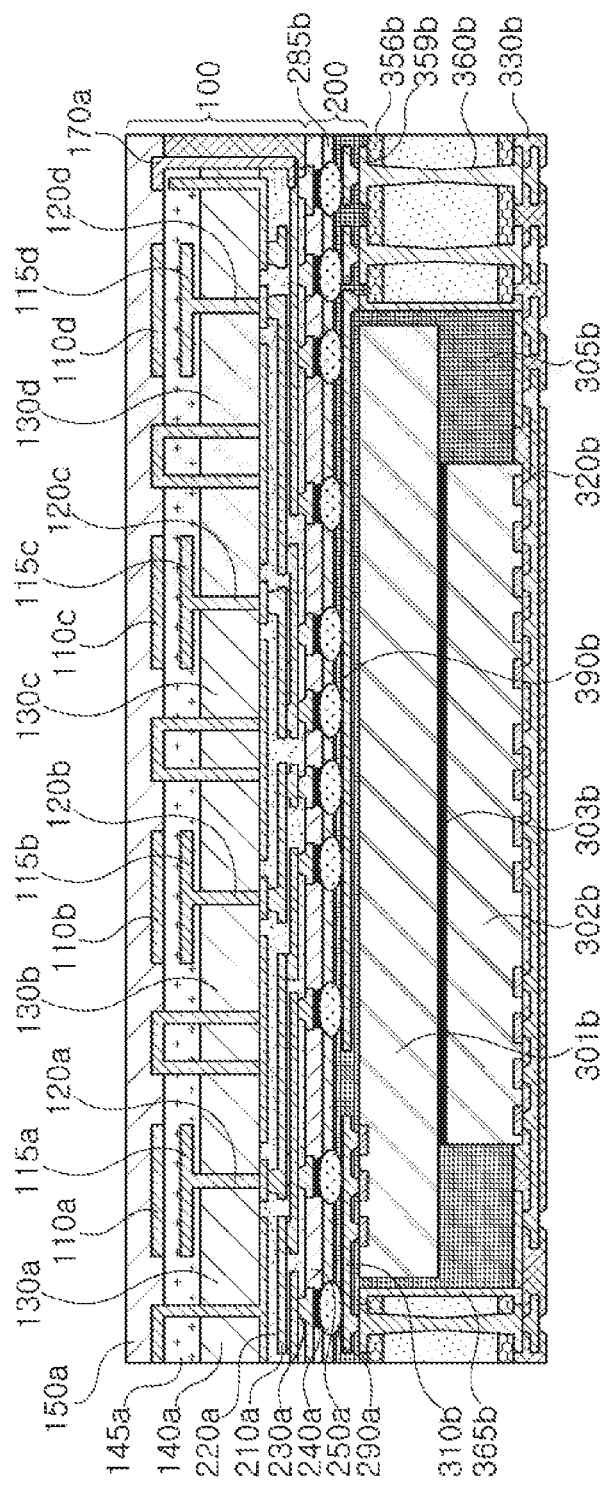
FIG. 5 is a cross-sectional view of an antenna module having first and second ICs according to an exemplary embodiment in the present disclosure.

FIG. 5 is a cross-sectional view of an antenna module having first and second ICs according to an exemplary embodiment in the present disclosure.

Referring to FIG. 5, the IC package may include at least portions of a first IC 301b, a second IC 302b, an adhesive member 303b, an encapsulant 305b, an upper end wiring layer 310b, a lower end wiring layer 320b, a passivation layer 330b, and a support member, and the support member may include at least portions of a dielectric layer 356b, a core wiring layer 359b, a core via 360b, and a core plating member 365b.

The IC package may have a structure similar to the IC package illustrated in FIG. 3 and may be disposed on a lower surface of the connection member 200.

Meanwhile, the first IC 301b may have a size different from a size of the second IC 302b and may be bonded to an inactive surface of the second IC 302b through the adhesive member 303b. The encapsulant 305b may cover the inactive surface of the first IC 301b exposed from the second IC 302b.

In addition, a heat sink member 390b may extend to cover a portions of the inactive surface of the first IC 301b and be connected to the connection pad 240a.

Other elements in FIG. 5, not described here and labeled with "xxxY" in which "xxx" is a number and "Y" is a letter, correspond to the above-described elements labeled with "xxxZ" in which "xxx" is a number and "Z" is letter. A detailed description of contents overlapping those described above is thus omitted.

Figure 6:
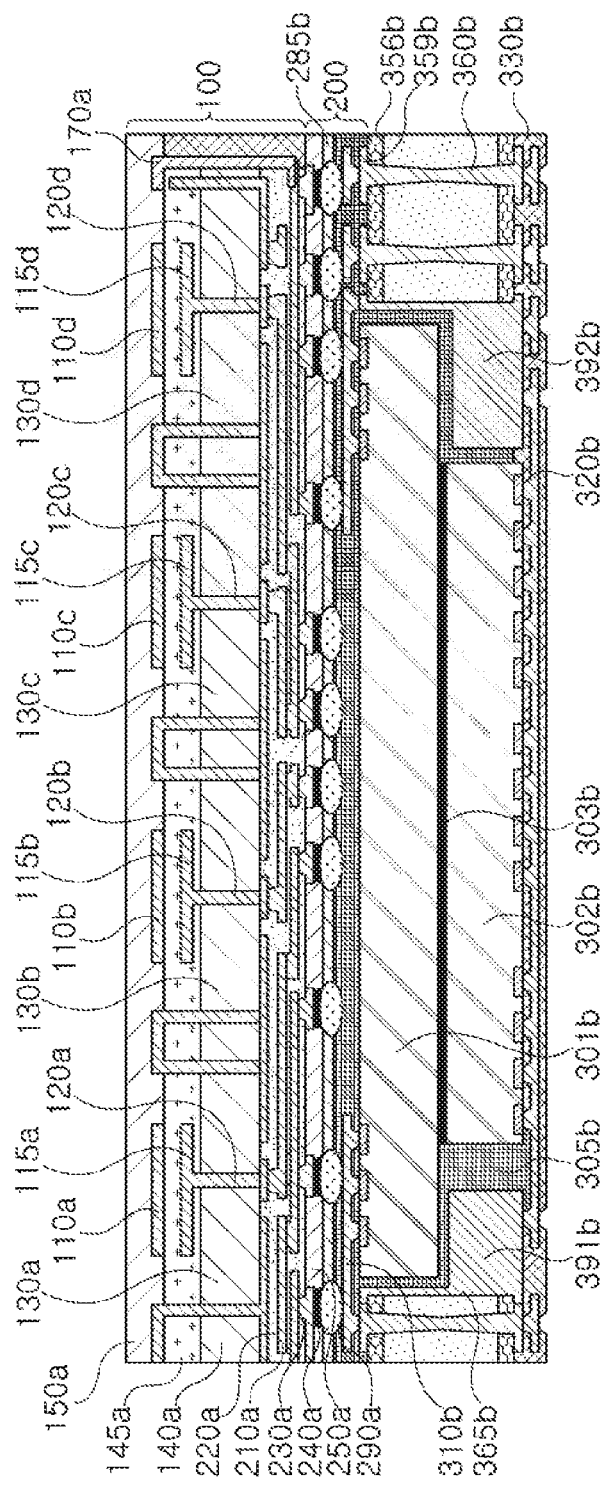
FIG. 6 is a cross-sectional view of an antenna module having first and second ICs and a heat sink member according to an exemplary embodiment in the present disclosure.

FIG. 6 is a cross-sectional view of an antenna module having first and second ICs and a heat sink member according to an exemplary embodiment in the present disclosure.

Referring to FIG. 6, the IC package may further include a first heat sink member 391b and a second heat sink member 392b disposed to occupy at least a portion of a space generated according to a difference between the size of the first IC 301b and the size of the second IC 302b. In this case, an encapsulant 305b may not completely occupy the space generated according to the difference between the size of the first IC 301b and the size of the second IC 302b.

Accordingly, heat generated from each of the first IC 301b and the second IC 302b may be efficiently concentrated on the first heat sink member 391b and the second heat sink member 392b, and the first heat sink member 391b and the second heat sink member 392b may rapidly discharge the transferred heat.

In addition, since the first heat sink member 391b and the second heat sink member 392b do not substantially increase a height of the IC package, the antenna module according to an exemplary embodiment in the present disclosure may improve antenna performance without substantially increasing a size thereof.

Other elements in FIG. 6, not described here and labeled with "xxxY" in which "xxx" is a number and "Y" is a letter, correspond to the above-described elements labeled with "xxxZ" in which "xxx" is a number and "Z" is a letter. A detailed description of contents overlapping those described above is thus omitted.

Figure 7:
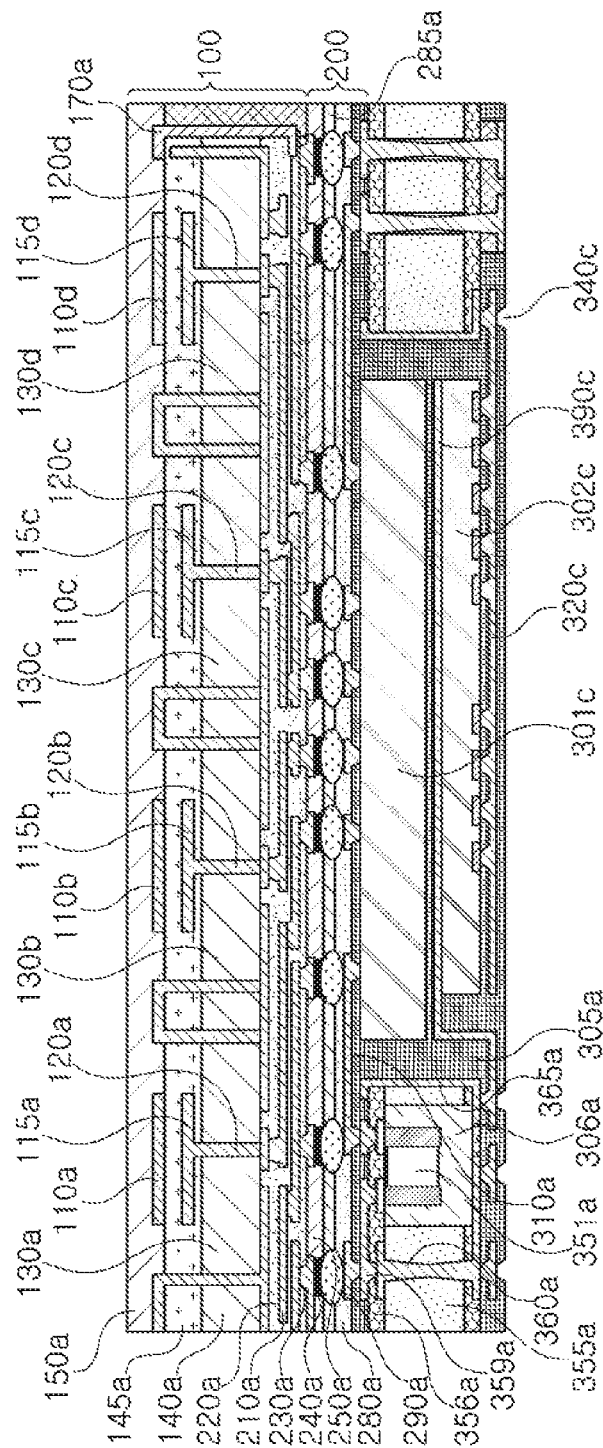
FIG. 7 is a cross-sectional view of an antenna module having first and second ICs and a heat sink member according to an exemplary embodiment in the present disclosure.

FIG. 7 is a cross-sectional view of an antenna module having first and second ICs and a heat sink member according to an exemplary embodiment in the present disclosure.

Referring to FIG. 7, the IC package may include a heat sink member 390c disposed between the inactive surface of the first IC 301c and the inactive surface of the second IC 302c.

For example, the heat sink member 390c may have a structure in which it is inserted between the inactive surface of the first IC 301c and the inactive surface of the second IC 302c through a region which is not covered by the lower end wiring layer 320c and the electrical connection structure 340c.

Accordingly, heat generated from each of the first IC 301c and the second IC 302c may be efficiently concentrated on the heat sink member 390c, and the heat sink member 390c may rapidly discharge the transferred heat.

In addition, since the heat sink member 390c does not substantially increase the height of the IC package, the antenna module according to an exemplary embodiment in the present disclosure may improve antenna performance without substantially increasing the size thereof.

Other elements in FIG. 7, not described here and labeled with "xxxY" in which "xxx" is a number and "Y" is a letter, correspond to the above-described elements "xxxZ" in which "xxx" is a number and "Z" is a letter. A detailed description of contents overlapping those described above is thus omitted.

FIGS. 8A through 8G are views illustrating a first process of manufacturing an IC package included in an antenna module according to an exemplary embodiment in the present disclosure.

Figure 8A:
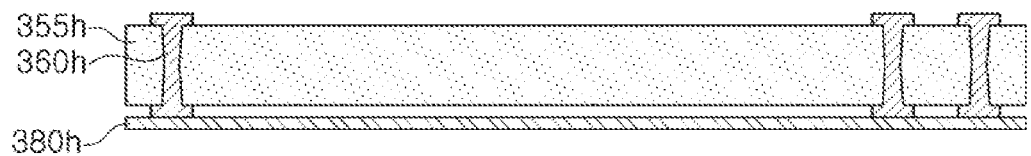
FIGS. 8A through 8G are views illustrating a first process of manufacturing an IC package included in an antenna module according to an exemplary embodiment in the present disclosure.

Referring to FIG. 8A, a support member 355h may be provided on a film 380h while having at least one hole, and a core via 360h may be formed in at least one hole of the support member 355h.

Figure 8B:
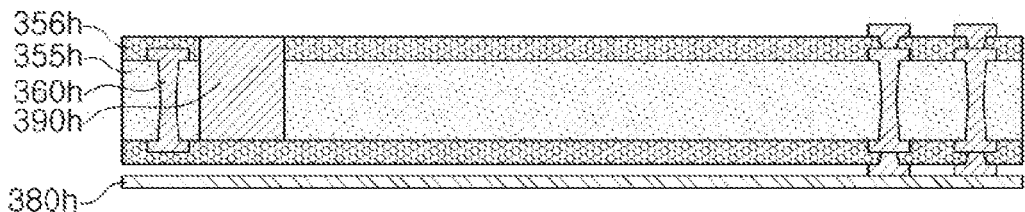

Referring to FIG. 8B, the core dielectric layer 356h may be formed on an upper surface and a lower surface of the support member 355h, and a heat sink member 390h such as a metal block which is releasable/removable from the support member 355h may be formed in the support member 355h.

Figure 8C:

Referring to FIG. 8C, a region in which at least one IC 300h is to be disposed in the support member 355h may be removed, and a core plating member 365h may be formed on a side surface of the region.

Figure 8D:
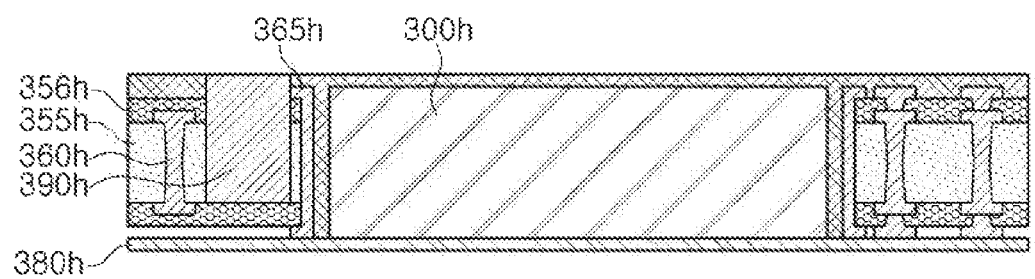

Referring to FIG. 8D, at least one IC 300h may be disposed in the region and at least one IC 300h may be encapsulated by the encapsulant.

Figure 8E:
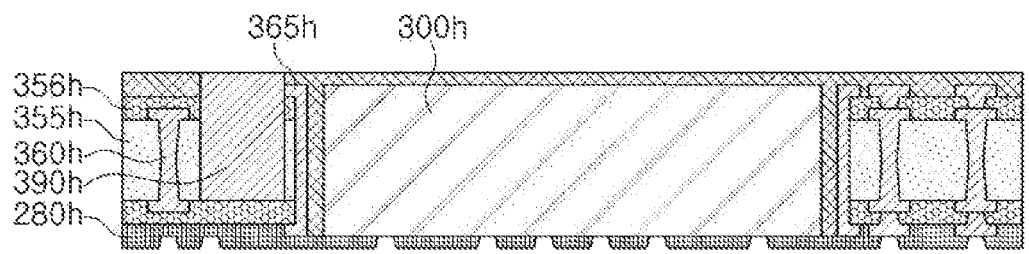

Referring to FIG. 8E, a film 380h may be removed and an insulating layer 280h may be formed on a lower surface of the IC 300h.

Figure 8F:
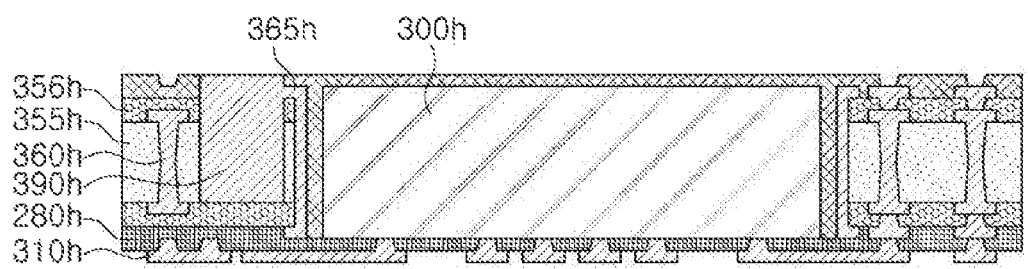

Referring to FIG. 8F, a wiring layer 310h may be formed on a lower surface of the insulating layer 280h and may be electrically connected to an active surface of the IC 300h.

Figure 8G:
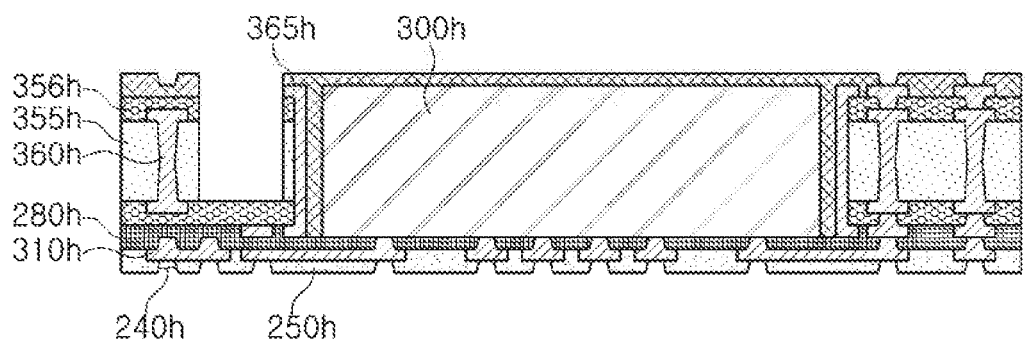

Referring to FIG. 8G, a connection pad 240h and a passivation layer 250h may be disposed on the wiring layer 310h, and at least a portion of the heat sink member 390h may be removed. The passive component and/or the second IC may be disposed in the region in which the heat sink member 390h is positioned.

FIGS. 9A through 9G are views illustrating a second process of manufacturing an IC package included in an antenna module according to an exemplary embodiment in the present disclosure.

Figure 9A:
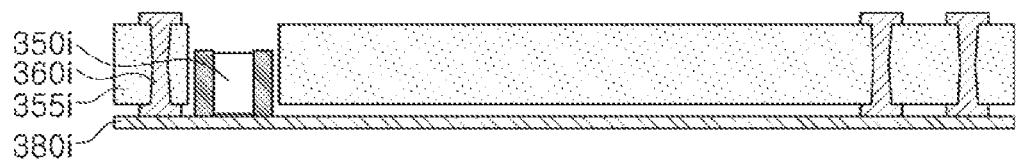
FIGS. 9A through 9G are views illustrating a second process of manufacturing an IC package included in an antenna module according to an exemplary embodiment in the present disclosure.

Referring to FIG. 9A, a support member 355i may be provided on a film 380i while having at least one hole and an accommodation space 306i, a core via 360i may be formed in at least one hole of the support member 355i, and a passive component 350i maybe disposed in the accommodation space 306i.

Figure 9B:
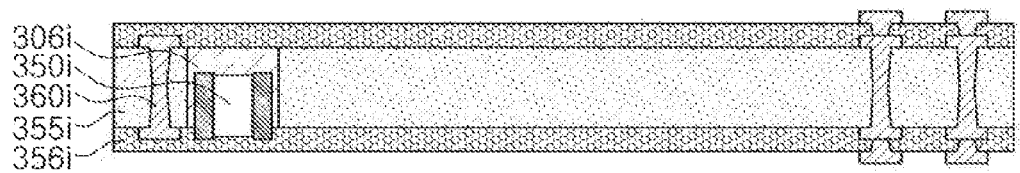

Referring to FIG. 9B, a core dielectric layer 356i may be formed on an upper surface and a lower surface of the support member 355i.

Figure 9C:
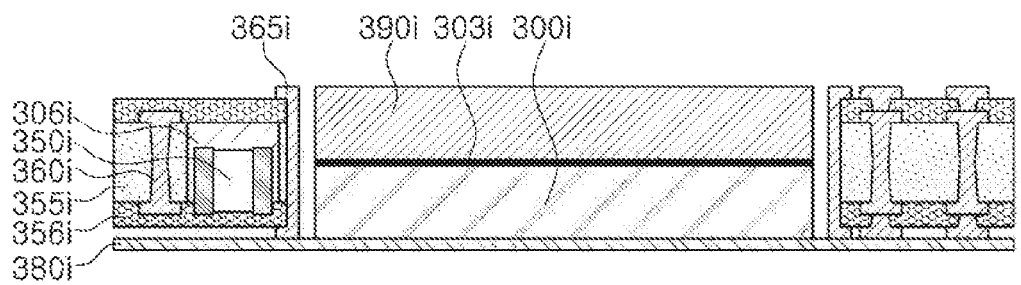

Referring to FIG. 9C, a region in which at least one IC 300i and a heat sink member 390i are to be disposed in the support member 355i may be removed, a core plating member 365i may be formed on a side surface of the region, and at least one IC 300i and the heat sink member 390i may be disposed in the region.

Figure 9D:
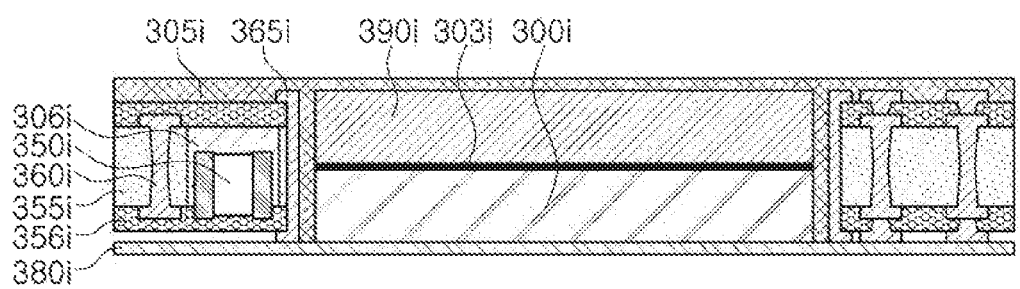

Referring to FIG. 9D, at least one IC 300i and the heat sink member 390i may be encapsulated by an encapsulant 305i. The IC package may be then rotated by 180°.

Figure 9E:
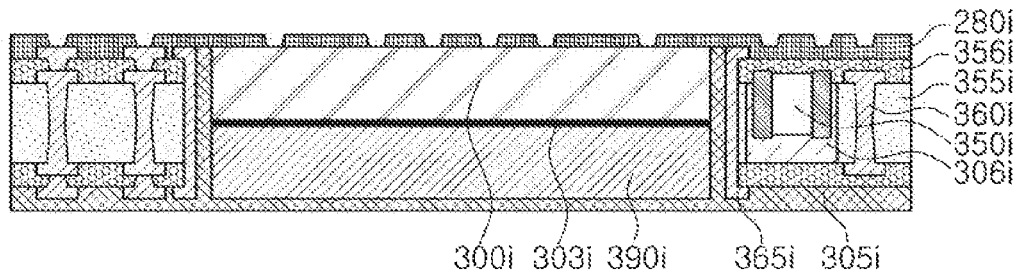

Referring to FIG. 9E, the film 380h may be removed and an insulating layer 280i may be formed on an upper surface of the IC 300i.

Figure 9F:
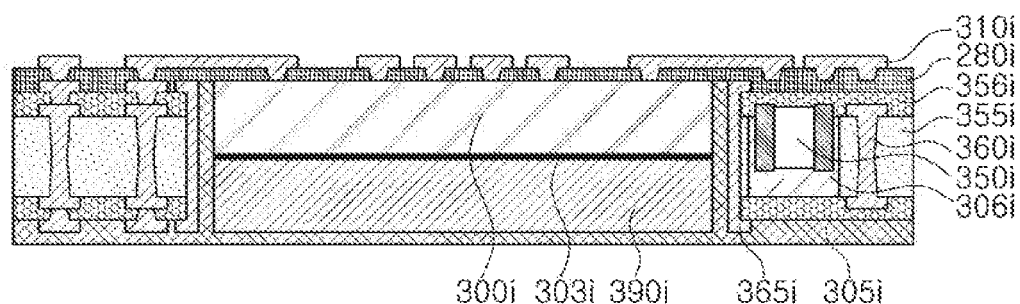

Referring to FIG. 9F, a wiring layer 310i may be formed on an upper surface of the insulating layer 280i and may be electrically connected to an active surface of the IC 300i.

Figure 9G:
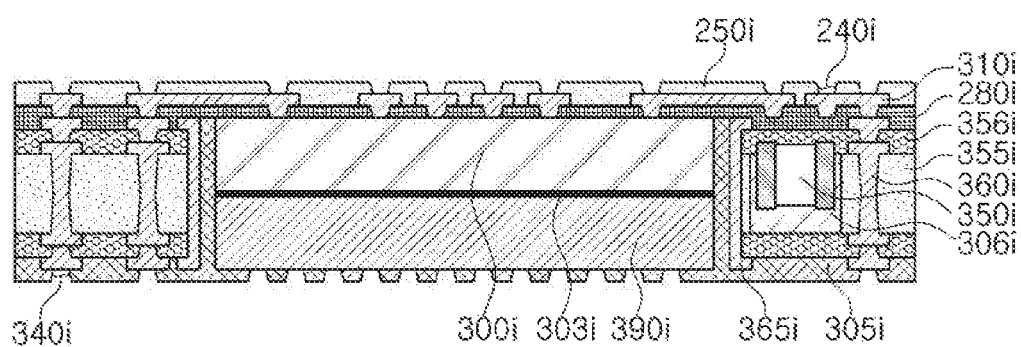

Referring to FIG. 9G, a connection pad 240i and a passivation layer 250i may be disposed on the wiring layer 310i.

Meanwhile, the plating layers/members, the core vias, the core plating members, the heat sink members, and wiring layers may be formed of a conductive material such as copper (Cu), aluminum (Al), silver (Ag), tin (Sn), gold (Au), nickel (Ni), lead (Pb), titanium (Ti), or an alloy thereof, and may be formed by a plating method such as chemical vapor deposition (CVD), physical vapor deposition (PVD), sputtering, subtractive, additive, semi-additive process (SAP), modified semi-additive process (MSAP), or the like, but is not limited thereto.

Figure 10:
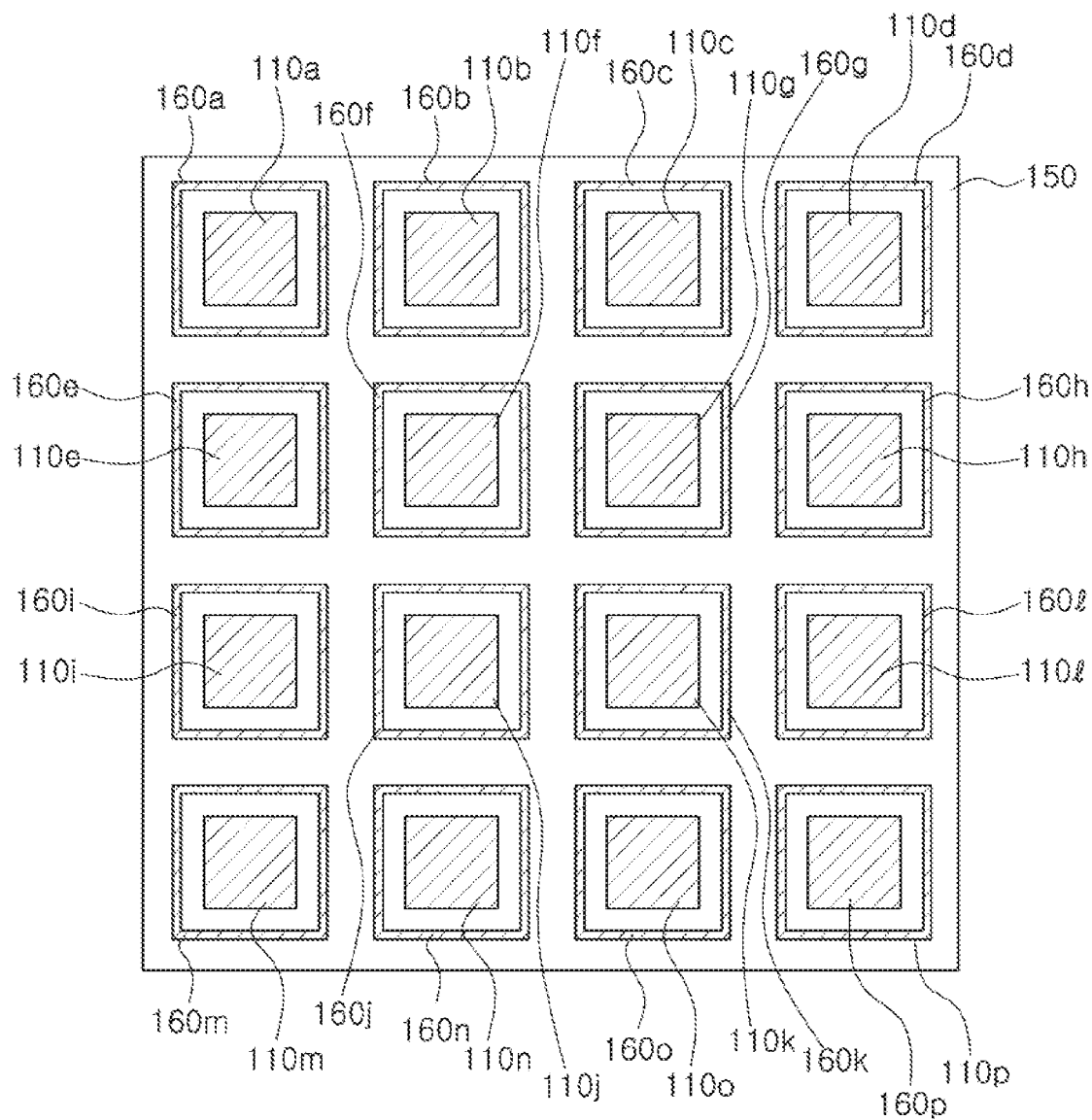
FIG. 10 is a view illustrating an upper surface of an antenna module according to an exemplary embodiment in the present disclosure.

FIG. 10 is a view illustrating an upper surface of an antenna module according to an exemplary embodiment in the present disclosure.

Referring to FIG. 10, each of a plurality of director members 110a, 110b, 110c, 110d, 110e, 110f, 110g, 110h, 110i, 110j, 110k, 110l, 110m, 110n, 110o, and 110p may have a form of a patch antenna, and may be surrounded by a corresponding plating member of a plurality of plating members 160a, 160b, 160c, 160d, 160e, 160f, 160g, 160h, 160i, 160j, 160k, 160l, 160m, 160n, 160o, and 160p. If the antenna module does not include the plurality of director members, the plurality of director members 110a, 110b, 110c, 110d, 110e, 110f, 110g, 110h, 110i, 110j, 110k, 110l, 110m, 110n, 110o, and 110p may be replaced with a plurality of antenna members.

Figure 11:
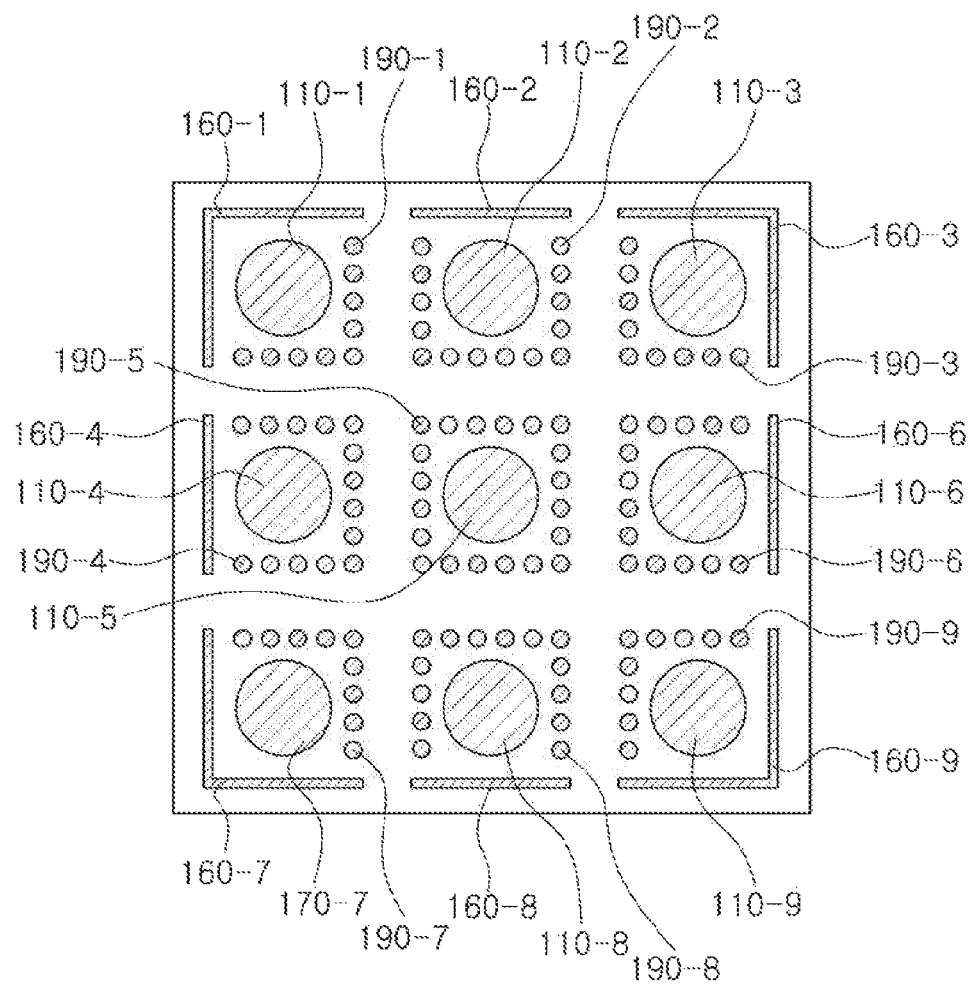
FIG. 11 is a view illustrating an upper surface of an antenna module according to an exemplary embodiment in the present disclosure.

FIG. 11 is a view illustrating an upper surface of an antenna module according to an exemplary embodiment in the present disclosure.

Referring to FIG. 11, each of a plurality of director members 110-1, 110-2, 110-3, 110-4, 110-5, 110-6, 110-7, 110-8, and 110-9 may be surrounded by at least one of corresponding plating members 160-1, 160-2, 160-3, 160-4, 160-5, 160-6, 160-7, 160-8, and 160-9, and a plurality of shielding members 190-1, 190-2, 190-3, 190-4, 190-5, 190-6, 190-7, 190-8, and 190-9. If the antenna module does not include the plurality of director members, the plurality of director members 110-1, 110-2, 110-3, 110-4, 110-5, 110-6, 110-7, 110-8, and 110-9 may be replaced with a plurality of antenna members.

Meanwhile, the number, layout, and shape of the plurality of director members or the plurality of antenna members illustrated in FIGS. 10 and 11 are not particularly limited. For example, the shape of the plurality of director members illustrated in FIG. 10 may be circular shape, and the number of the plurality of antenna members illustrated in FIG. 11 may be four.

Figure 12A:
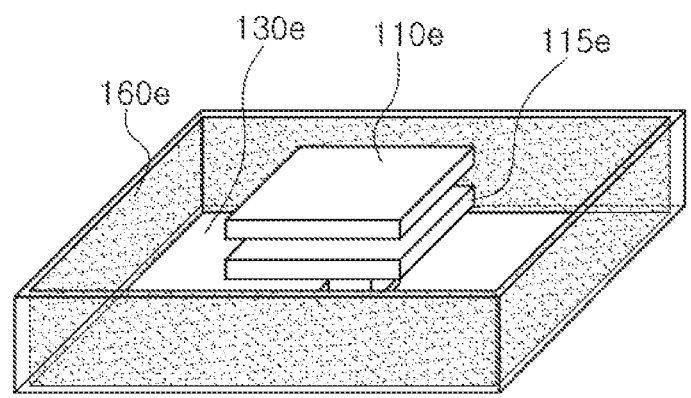
FIGS. 12A through 12C are perspective views each illustrating an example of a cavity of an antenna package according to an exemplary embodiment in the present disclosure.
Figure 12B:
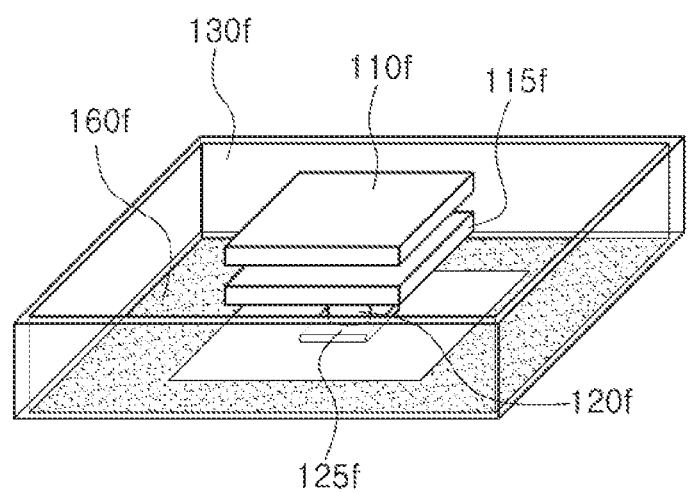
Figure 12C:
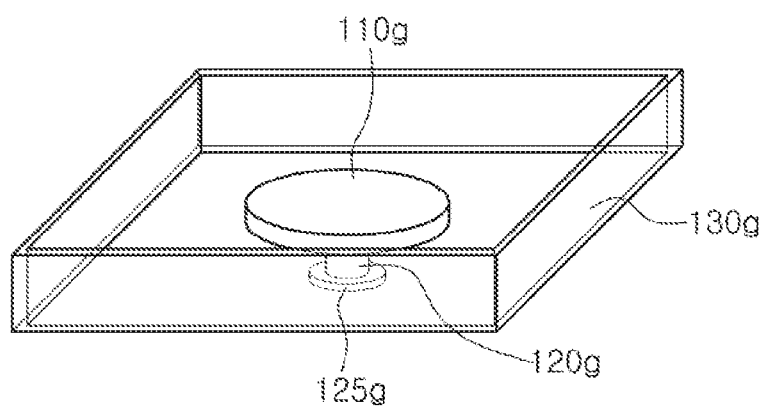

FIGS. 12A through 12C are perspective views each illustrating an example of a cavity of an antenna package according to an exemplary embodiment in the present disclosure.

Referring to FIG. 12A, a cavity may include at least portions of a director member 110e, an antenna member 115e, a feed via, an electrical connection structure, a dielectric layer 130e, and a plating member 160e. Here, the plating member 160e may be disposed to surround side surfaces of the cavity. That is, a lower surface of the cavity may be covered by a ground pattern disposed on an upper surface of the connection member.

Referring to FIG. 12B, the cavity may include at least portions of a director member 110f, an antenna member 115f, a feed via 120f, an electrical connection structure 125f, a dielectric layer 130f, and a plating member 160f. Here, the plating member 160f may be disposed to cover a portion of the lower surface of the cavity. That is, the side surfaces of the cavity may be surrounded by the plating member disposed on side surfaces of an insulating member on the connection member. Accordingly, isolation between the connection member and the IC of the antenna package may be improved.

Referring to FIG. 12C, the cavity may include at least portions of an antenna member 110g, a feed via 120g, an electrical connection structure 125g, and a dielectric layer 130g. That is, the side surfaces of the cavity may be surrounded by the plating member disposed on the side surfaces of the insulating member on the connection member, and the lower surface of the cavity may be covered by the ground pattern disposed on the upper surface of the connection member.

Meanwhile, the electrical connection structures 125f and 125g may be connected to a corresponding wire of at least one wiring layer 210 of the connection member when the antenna package and the connection member are coupled to each other. For example, the electrical connection structures 125f and 125g may be implemented in electrodes, pins, solder balls, lands, and the like.

Figure 13:
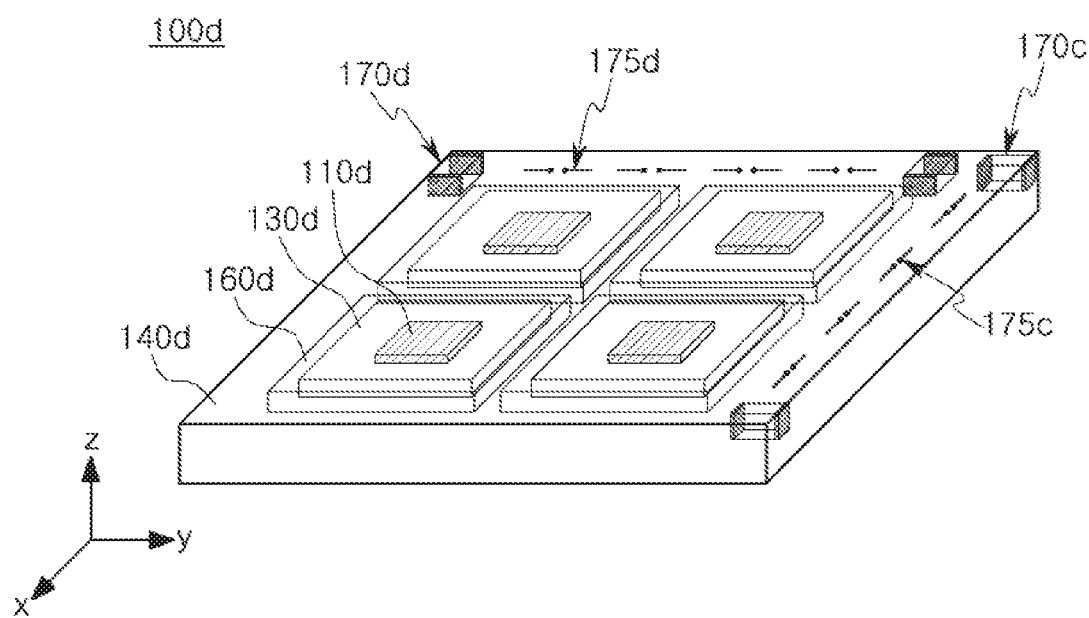
FIG. 13 is a perspective view illustrating an example of an antenna package according to an exemplary embodiment in the present disclosure.

FIG. 13 is a perspective view illustrating an example of an antenna package according to an exemplary embodiment in the present disclosure.

Referring to FIG. 13, an antenna package may include a plurality of director members 110d, a cavity 130d, a dielectric layer 140d, a plating member 160d, a plurality of directional antennal member 170c and 170d, and a plurality of dipole antennas 175c and 175d.

The plurality of director members 110d may transmit and receive an RF signal in a z axis direction together with corresponding antenna members.

The plurality of second directional antenna members 170c and 170d may be disposed to be adjacent to an edge of the antenna package and to be stood up in the z axis direction, and one of the plurality of directional antennas 170c and 170d may transmit and receive a second RF signal in an x axis direction and the other thereof may transmit and receive the second RF signal in a y axis direction.

The plurality of dipole antennas 175c and 175d may be disposed between the dielectric layer 140d and an encapsulation member to be adjacent to the edge of the antenna package, and one of the plurality of dipole antennas 175c and 175d may transmit and receive a third RF signal in the x axis direction and the other thereof may transmit and receive the third RF signal in the y axis direction. Depending on a design, at least a portion of the plurality of dipole antennas 175c and 175d may be replaced with a monopole antenna.

Meanwhile, the IC package disclosed herein may be implemented according to a fan-out semiconductor package to be described below. To facilitate understanding of the fan-out semiconductor package, a description will be made with reference to FIGS. 14 through 21.

Figure 14:
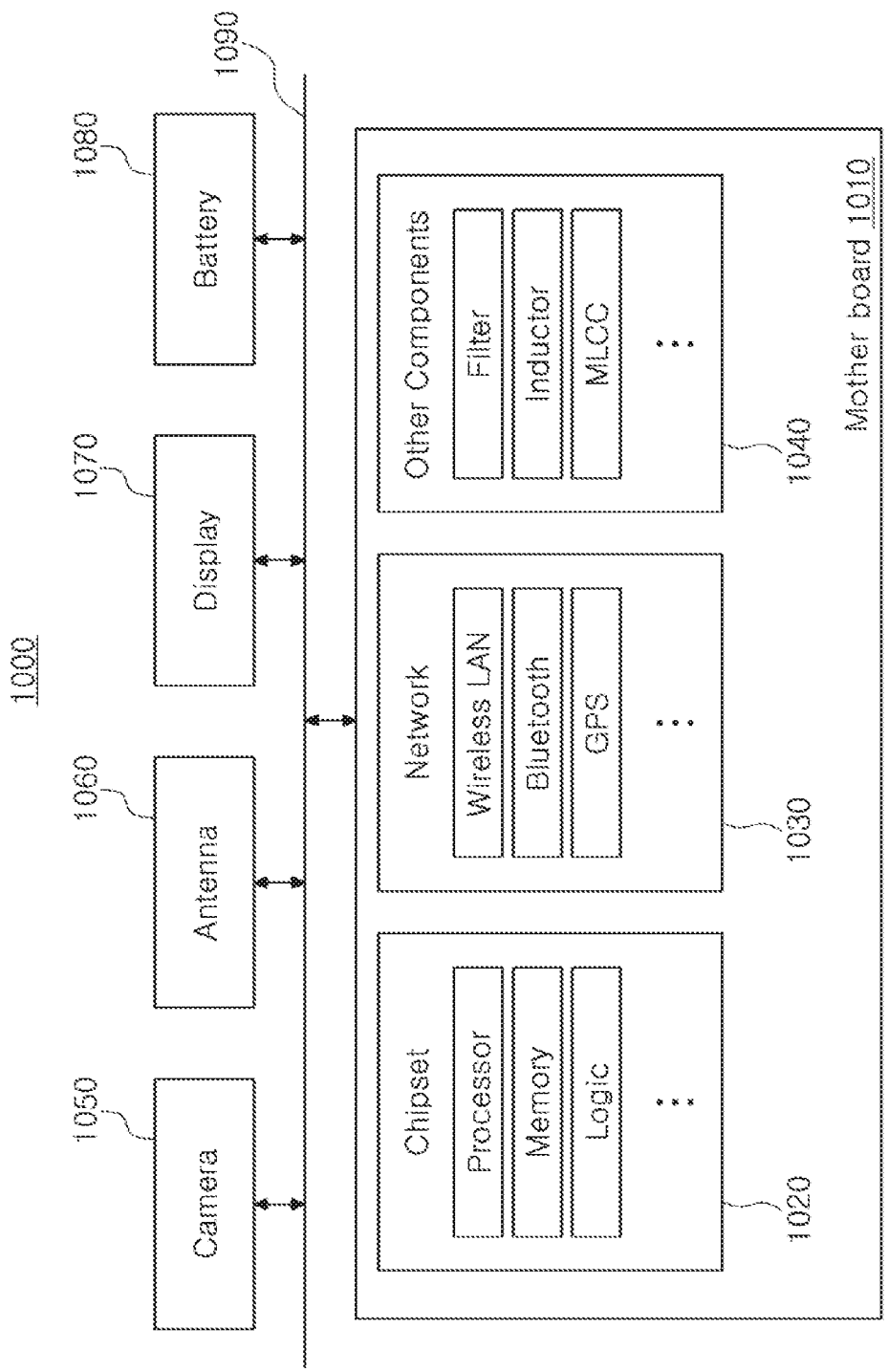
FIG. 14 is a schematic block diagram illustrating an example of an electronic device system.

FIG. 14 is a schematic block diagram illustrating an example of an electronic device system.

Referring to FIG. 14, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network related components 1030 are not limited thereto, but may also include a variety of other wireless or wired standards or protocols. In addition, the network related components 1030 maybe combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 15:
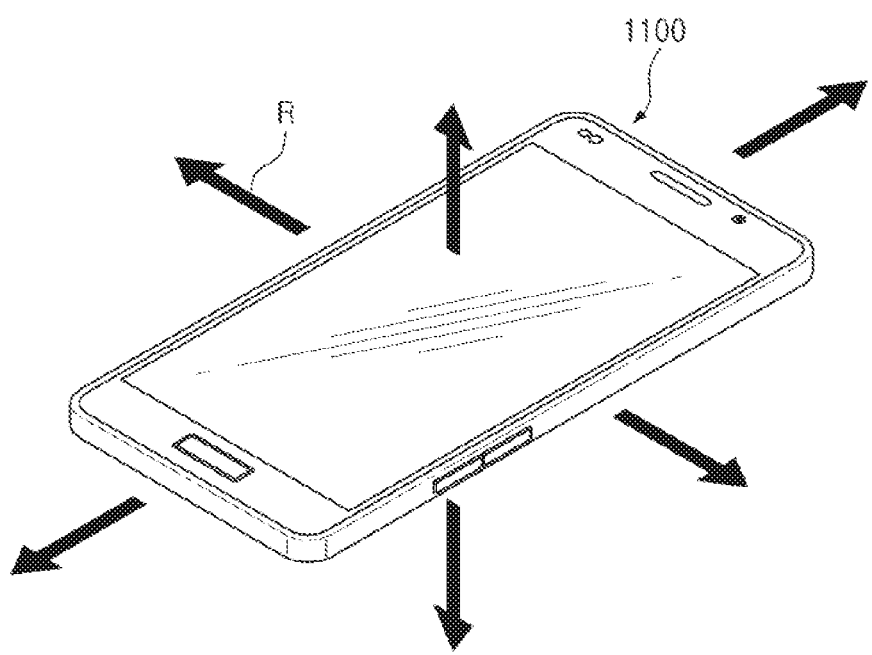
FIG. 15 is a schematic perspective view illustrating an example of an electronic device.

FIG. 15 is a schematic perspective view illustrating an example of an electronic device.

Referring to FIG. 15, an electronic device may be, for example, a smartphone 1100. In the smartphone 1100, a radio frequency integrated circuit (RFIC) may be used in a semiconductor package form, and an antenna may be used in a substrate or module form. The RFIC and the antenna may be electrically connected to each other in the smartphone 1100, and radiation R of antenna signals in various directions may be thus possible. A semiconductor package including the RFIC and a substrate or a module including the antenna may be used in various forms in an electronic device such as the smartphone, or the like.

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor chip and the mainboard is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Figure 16B:
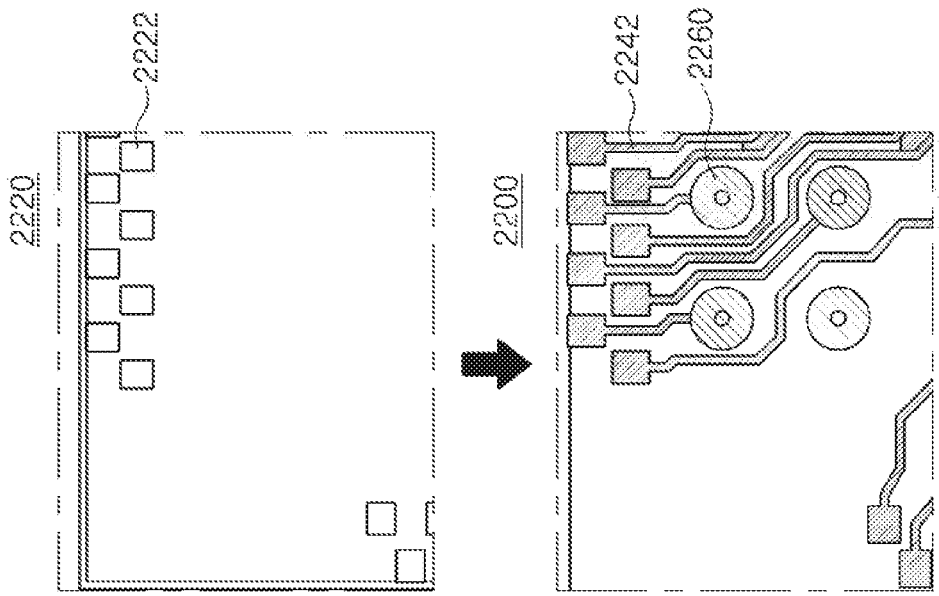
FIGS. 16A and 16B are a schematic cross-sectional view illustrating states of a fan-in semiconductor package before and after being packaged.
Figure 16A:
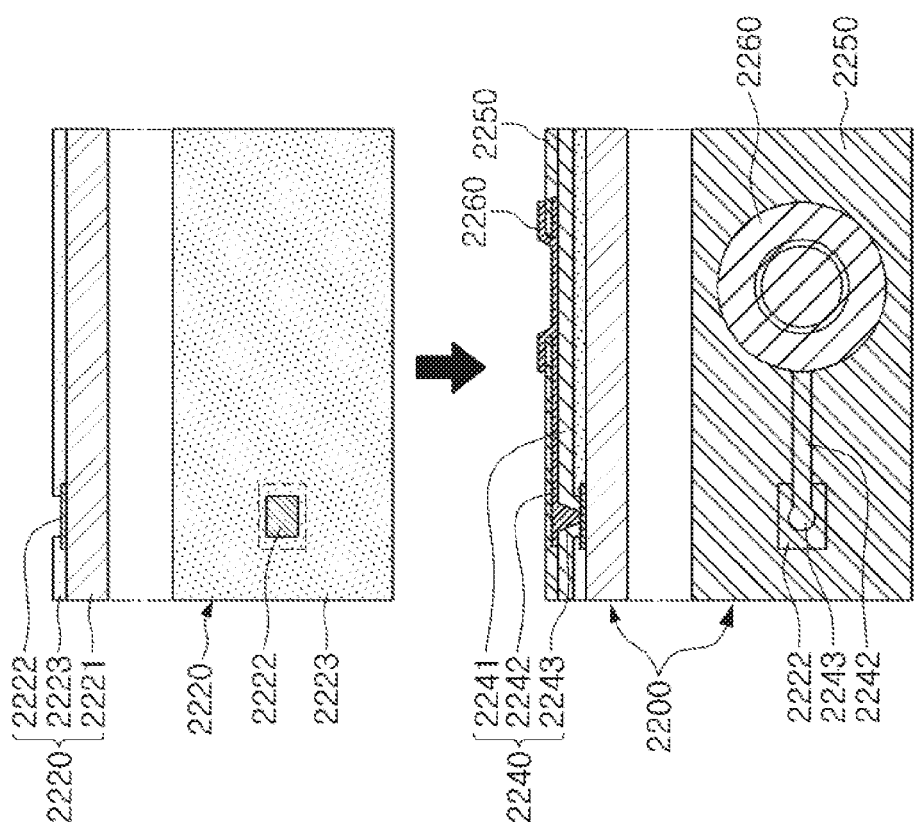

FIGS. 16A and 16B are schematic cross-sectional views illustrating states of a fan-in semiconductor package before and after being packaged.

Figure 17:
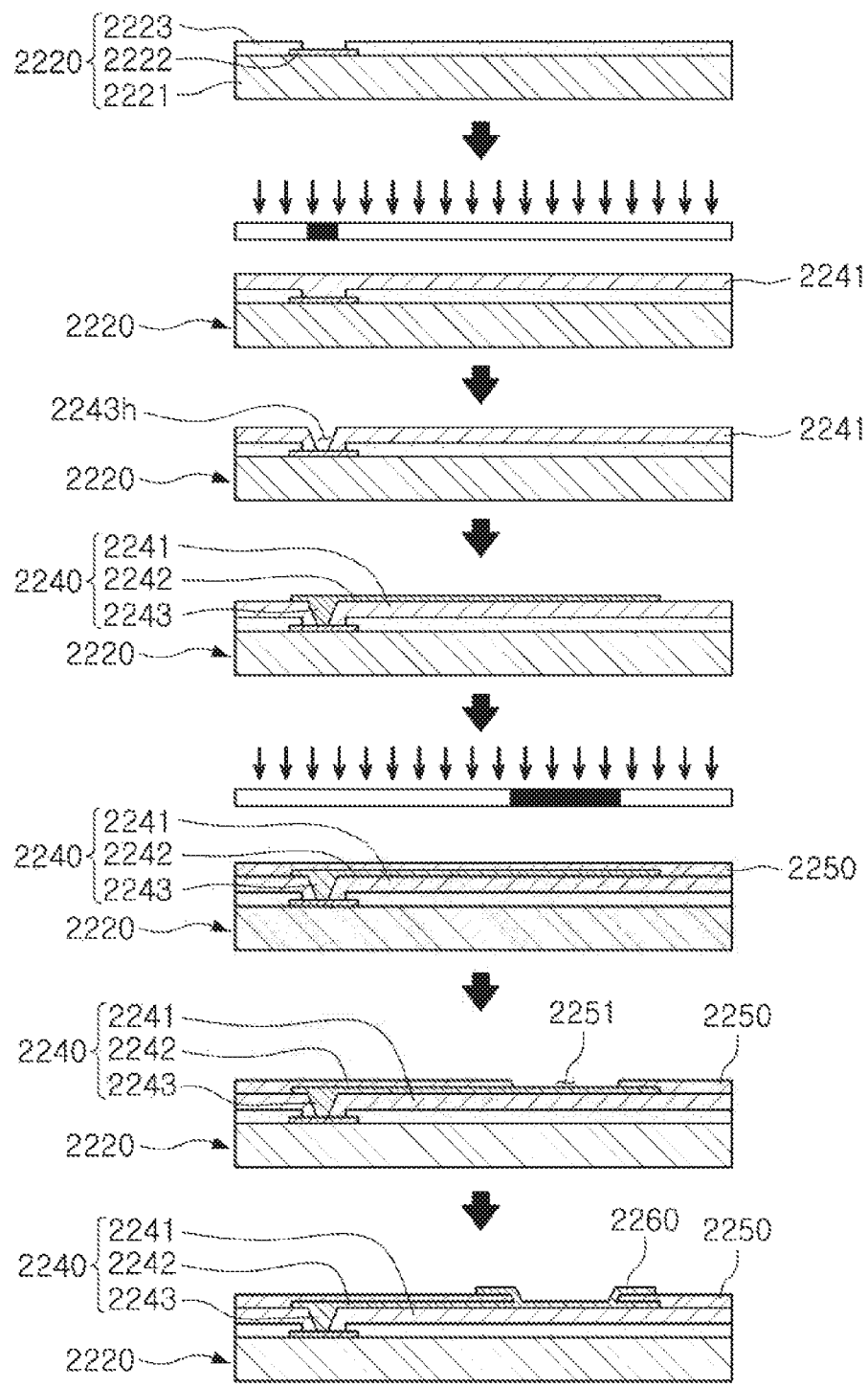
FIG. 17 is schematic cross-sectional views illustrating a packaging process of a fan-in semiconductor package.

FIG. 17 is schematic cross-sectional views illustrating a packaging process of a fan-in semiconductor package.

Referring to FIGS. 16A, 16B and 17, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 are significantly small, it is difficult to mount the integrated circuit (IC) on an intermediate level printed circuit board (PCB) as well as on the mainboard of the electronic device, or the like.

Therefore, a connection member 2240 may be formed depending on a size of the semiconductor chip 2220 on the semiconductor chip 2220 in order to redistribute the connection pads 2222. The connection member 2240 maybe formed by forming an insulating layer 2241 on the semiconductor chip 2220 using an insulating material such as photoimagable dielectric (PID) resin, forming via holes 2243h opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, maybe formed. That is, a fan-in semiconductor package 2200 including, for example, the semiconductor chip 2220, the connection member 2240, the passivation layer 2250, and the under-bump metal layer 2260 may be manufactured through a series of processes.

As described above, the fan-in semiconductor package may have a package form in which all of the connection pads, for example, input/output (I/O) terminals, of the semiconductor chip, are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has a large spatial limitation. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the mainboard of the electronic device. The reason is that even in a case that a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the mainboard of the electronic device.

Figure 18:
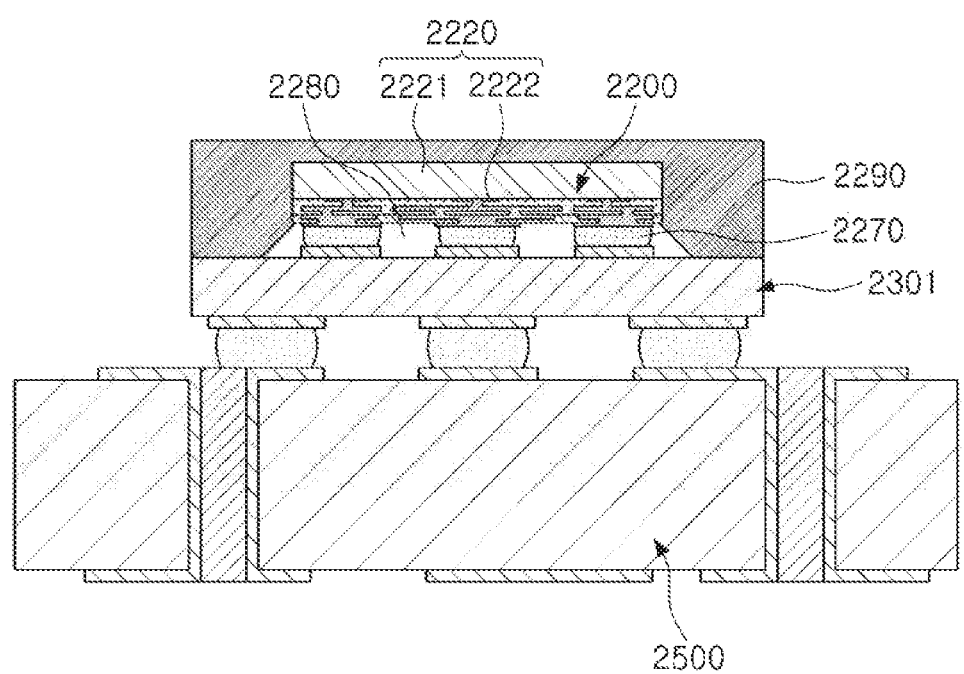
FIG. 18 is a schematic cross-sectional view illustrating a case in which a fan-in semiconductor package is mounted on an interposer substrate and is finally mounted on a main board of an electronic device.

FIG. 18 is a schematic cross-sectional view illustrating a case in which a fan-in semiconductor package is mounted on an interposer substrate and is ultimately mounted on a mainboard of an electronic device.

Figure 19:
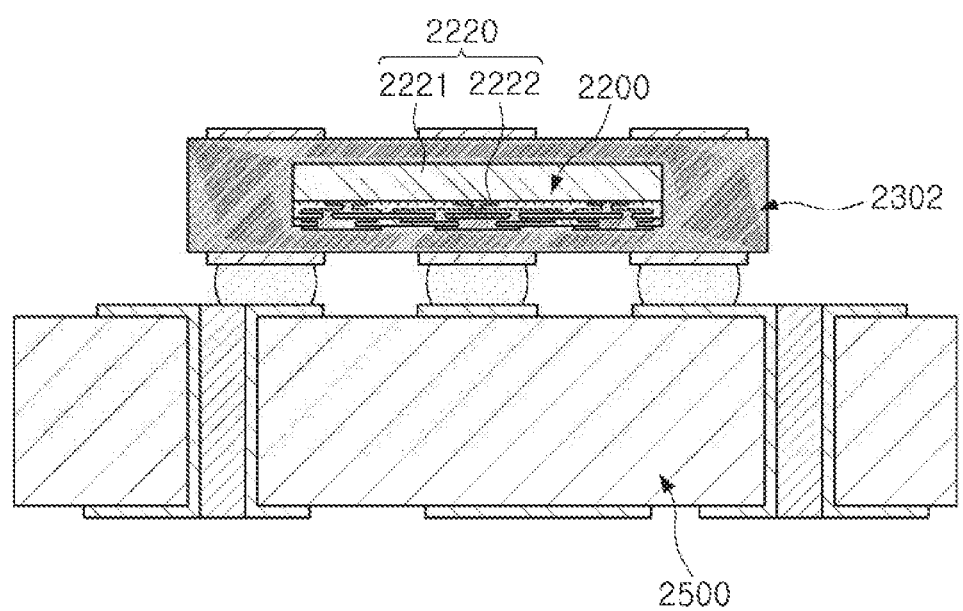
FIG. 19 is a schematic cross-sectional view illustrating a case in which a fan-in semiconductor package is embedded in an interposer substrate and is finally mounted on a main board of an electronic device.

FIG. 19 is a schematic cross-sectional view illustrating a case in which a fan-in semiconductor package is embedded in an interposer substrate and is ultimately mounted on a mainboard of an electronic device.

Referring to FIGS. 18 and 19, in a fan-in semiconductor package 2200, connection pads 2222, that is, I/O terminals, of a semiconductor chip 2220 may be redistributed through an interposer substrate 2301, and the fan-in semiconductor package 2200 may be ultimately mounted on a mainboard 2500 of an electronic device in a state in which it is mounted on the interposer substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate interposer substrate 2302, connection pads 2222, that is, I/O terminals, of the semiconductor chip 2220 may be redistributed by the interposer substrate 2302 in a state in which the fan-in semiconductor package 2200 is embedded in the interposer substrate 2302, and the fan-in semiconductor package 2200 may be ultimately mounted on a mainboard 2500 of an electronic device.

As described above, it maybe difficult to directly mount and use the fan-in semiconductor package on the mainboard of the electronic device. Therefore, the fan-in semiconductor package maybe mounted on the separate interposer substrate and be then mounted on the mainboard of the electronic device through a packaging process or may be mounted and used on the mainboard of the electronic device in a state in which it is embedded in the interposer substrate.

Figure 20:
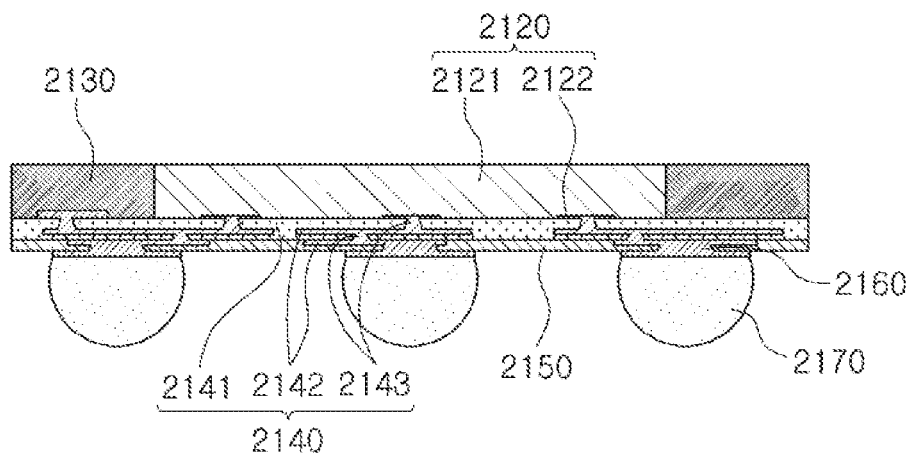
FIG. 20 is a schematic cross-sectional view illustrating a fan-out semiconductor package.

FIG. 20 is a schematic cross-sectional view illustrating a fan-out semiconductor package.

Referring to FIG. 20, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may be further formed on the connection member 2140, and an underbump metal layer 2160 maybe further formed in openings of the passivation layer 2150. Solder balls 2170 may be further formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in a case that a size of the semiconductor chip is decreased, a standardized ball layout may be used in the fan-out semiconductor package as it is, such that the fan-out semiconductor package may be mounted on the mainboard of the electronic device without using a separate interposer substrate, as described below.

Figure 21:
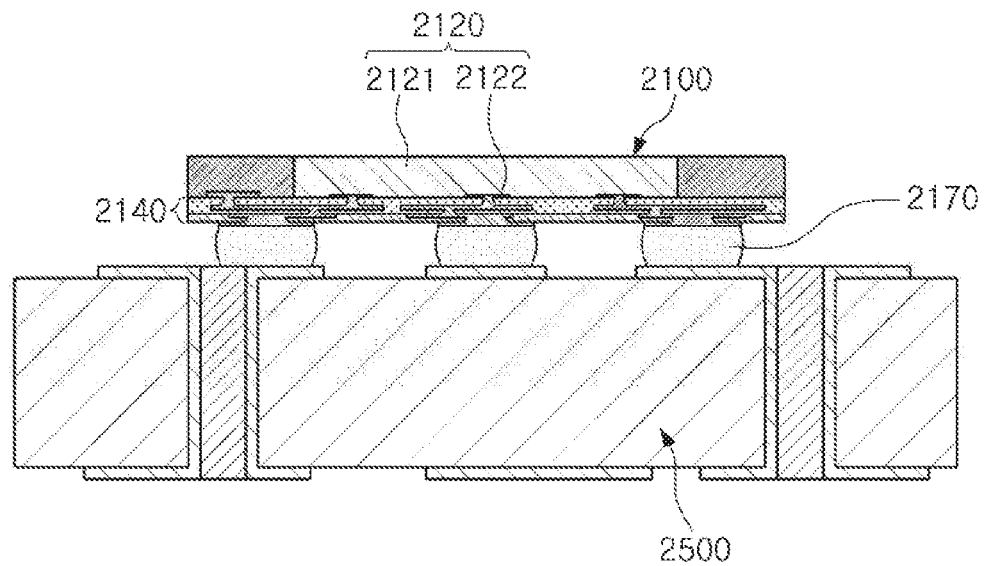
FIG. 21 is a schematic cross-sectional view illustrating a case in which a fan-out semiconductor package is mounted on a main board of an electronic device.

FIG. 21 is a schematic cross-sectional view illustrating a case in which a fan-out semiconductor package is mounted on a mainboard of an electronic device.

Referring to FIG. 21, a fan-out semiconductor package 2100 may be mounted on a mainboard 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate interposer substrate, or the like.

As described above, since the fan-out semiconductor package may be mounted on the mainboard of the electronic device without using the separate interposer substrate, the fan-out semiconductor package may be implemented at a thickness lower than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem due to occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as an interposer substrate, or the like, having a scale, a purpose, and the like, different from those of the fan-out semiconductor package, and having the fan-in semiconductor package embedded therein.

As set forth above, according to the exemplary embodiments in the present disclosure, the antenna module may be easily miniaturized, while having the high level of antenna performance.

The antenna module according to the exemplary embodiment in the present disclosure may efficiently discharge the heat by concentrating the heat generated from the IC on the heat sink member.

The antenna module according to the exemplary embodiment in the present disclosure may reduce a negative influence (e.g., heat, noise) between the plurality of ICs while using the plurality of ICs and may be miniaturized.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with one another. For example, one element described in a particular exemplary embodiment, even if it is not described in another exemplary embodiment, may be understood as a description related to another exemplary embodiment, unless an opposite or contradictory description is provided therein.

While exemplary embodiments have been shown and described above, it will be apparent to those skilled in the art that modifications and variations could be made without departing from the scope of the present invention as defined by the appended claims.

What is claimed is:

1. An antenna module comprising:
 a connection member including at least one wiring layer and at least one insulating layer;
 an integrated circuit (IC) package disposed on a first surface of the connection member;
 a plurality of antenna members configured to transmit and receive a radio frequency (RF) signal;
 a plurality of feed vias in which one end of each thereof is electrically connected to each of the plurality of antenna members and other end of each of thereof is electrically connected to a corresponding wire of the at least one wiring layer of the connection member;
 a dielectric layer disposed to surround side surfaces of each of the plurality of feed vias and having a height greater than that of the at least one insulating layer of the connection member, and disposed on a second surface of the connection member, wherein the IC package includes:
a first IC having a first active surface electrically connected to the at least one wiring layer and a first inactive surface opposing the first active surface, and configured to generate the RF signal;
a first heat sink member disposed on the first inactive surface of the first IC;
an encapsulant encapsulating at least portions of the first IC and the first heat sink member; and
at least one core via disposed on side surfaces of the first IC and electrically connected to the at least one wiring layer.

2. The antenna module of claim 1, wherein the IC package further includes:
a support member having a through-hole in which the first IC and the first heat sink member are disposed and having at least a portion encapsulated by the encapsulant; and
a core plating member disposed on a side surface of the support member toward the first IC and the first heat sink member, and the first heat sink member is electrically connected to the core plating member.

3. The antenna module of claim 2, wherein the support member includes a core insulating layer, a core via penetrating through the core insulating layer and electrically connected to the corresponding wire of the at least one wiring layer, and a core wiring layer disposed on a first surface or a second surface of the core insulating layer and electrically connected to the core via.

4. The antenna module of claim 2, wherein the IC package further includes a passive component electrically connected to the corresponding wire of the at least one wiring layer, and
the support member provides an accommodation space accommodating the passive component.

5. The antenna module of claim 4, wherein the support member further includes a core interior plating member disposed to surround the passive component in the accommodation space.

6. The antenna module of claim 2, wherein the support member has a height greater than that of the first IC, and
the first heat sink member protrudes from a level of a lower surface of the support member.

7. The antenna module of claim 1, wherein the IC package further includes:
a core via having one end electrically connected to the corresponding wire of the at least one wiring layer, and other end electrically connected to an electrical connection structure.

8. The antenna module of claim 7, wherein the core via receives a base signal or power through the electrical connection structure and transmits the base signal or power to the first active surface of the first IC, and
the first IC generates the RF signal of a millimeter wave (mmWave) band based on the base signal or power and transmits the RF signal to the plurality of antenna members through the first active surface of the first IC.

9. The antenna module of claim 1, wherein the IC package further includes:
a second IC having a second active surface electrically connected to the at least one wiring layer and a second inactive surface opposing the second active surface, and configured to generate a base signal or power and transmit the base signal or power to the first IC; and
a second heat sink member disposed on the second inactive surface of the second IC.

10. The antenna module of claim 9, wherein the IC package further includes:
a support member having first and second through-holes in which the first IC and the second IC are respectively disposed; and
core plating members disposed on side surfaces of the support member toward the first IC and the second IC, and
at least one of the first heat sink member and the second heat sink member is electrically connected to the core plating members.

11. An antenna module comprising:
a connection member including at least one wiring layer and at least one insulating layer;
an integrated circuit (IC) package disposed on a first surface of the connection member;
a plurality of antenna members configured to transmit and receive a radio frequency (RF) signal;
a plurality of feed vias in which one end of each thereof is electrically connected to each of the plurality of antenna members and the other end of each of thereof is electrically connected to a corresponding wire of the at least one wiring layer of the connection member;
wherein the IC package includes:
a first IC having a first active surface electrically connected to the at least one wiring layer and a first inactive surface opposing the first active surface, and configured to generate the RF signal;
a first heat sink member disposed on the first inactive surface of the first IC;
a support member having a through-hole in which the first IC and the first heat sink member are disposed; and
a core plating member disposed on a side surface of the support member toward the first IC and the first heat sink member.

12. The antenna module of claim 11, wherein the first heat sink member is electrically connected to the core plating member.

* * * * *